(12) United States Patent
Chen et al.

(10) Patent No.: US 11,037,835 B2
(45) Date of Patent: Jun. 15, 2021

(54) ISOLATION MANUFACTURING METHOD FOR SEMICONDUCTOR STRUCTURES

(71) Applicant: Taiwan Semiconductor Manufacturing Co., Ltd., Hsin-Chu (TW)

(72) Inventors: I-Sheng Chen, Taipei (TW); Tzu-Chiang Chen, Hsinchu (TW); Chih-Sheng Chang, Hsinchu (TW); Cheng-Hsien Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/392,189

(22) Filed: Apr. 23, 2019

(65) Prior Publication Data
US 2019/0252266 A1    Aug. 15, 2019

Related U.S. Application Data

(63) Continuation of application No. 15/628,345, filed on Jun. 20, 2017, now Pat. No. 10,283,414.

(51) Int. Cl.
| | |
|---|---|
| *H01L 21/8234* | (2006.01) |
| *H01L 21/762* | (2006.01) |
| *H01L 27/088* | (2006.01) |
| *H01L 29/06* | (2006.01) |
| *H01L 29/04* | (2006.01) |

(Continued)

(52) U.S. Cl.
CPC ...... *H01L 21/823481* (2013.01); *B82Y 10/00* (2013.01); *H01L 21/76224* (2013.01); *H01L 21/823431* (2013.01); *H01L 21/823807* (2013.01); *H01L 27/0886* (2013.01); *H01L 27/092* (2013.01); *H01L 29/045* (2013.01); *H01L 29/0653* (2013.01);

(Continued)

(58) Field of Classification Search
CPC ....... H01L 21/823481; H01L 21/76224; H01L 21/823431
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

FOREIGN PATENT DOCUMENTS

| | | |
|---|---|---|
| DE | 102013110023 A1 | 2/2015 |
| JP | 2006135209 A1 | 5/2006 |
| KR | 20060110702 A | 9/1998 |

*Primary Examiner* — Errol V Fernandes
(74) *Attorney, Agent, or Firm* — Haynes & Boone, LLP

(57) ABSTRACT

A method of forming a semiconductor device includes providing a semiconductor structure that includes a first semiconductor material extending from a first region to a second region. The method further includes removing a portion of the first semiconductor material in the second region to form a recess, where the recess exposes a sidewall of the first semiconductor material disposed in the first region; forming a dielectric material covering the sidewall; while the dielectric material covers the sidewall, epitaxially growing a second semiconductor material in the second region adjacent the dielectric material; and forming a first fin including the first semiconductor material and a second fin including the second semiconductor material.

19 Claims, 16 Drawing Sheets

(51) Int. Cl.

| | |
|---|---|
| *H01L 29/775* | (2006.01) |
| *H01L 27/092* | (2006.01) |
| *B82Y 10/00* | (2011.01) |
| *H01L 21/8238* | (2006.01) |
| *H01L 29/10* | (2006.01) |
| *H01L 29/66* | (2006.01) |

(52) U.S. Cl.
   CPC ...... *H01L 29/0673* (2013.01); *H01L 29/1079* (2013.01); *H01L 29/66439* (2013.01); *H01L 29/775* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,786,757 B2 | 10/2017 | Su et al. |
| 9,837,405 B1 | 12/2017 | Cheng et al. |
| 2009/0209083 A1 | 8/2009 | Chen et al. |
| 2009/0218632 A1* | 9/2009 | Cheng ............ H01L 21/823842 257/369 |
| 2013/0320294 A1 | 12/2013 | Cappellani et al. |
| 2014/0027058 A1 | 1/2014 | Cohen et al. |
| 2016/0163810 A1 | 6/2016 | Huang et al. |
| 2017/0104060 A1 | 4/2017 | Balakrishnan et al. |
| 2017/0104061 A1 | 4/2017 | Peng et al. |
| 2017/0110201 A1 | 4/2017 | Lien et al. |
| 2017/0140996 A1 | 5/2017 | Lin et al. |
| 2019/0097055 A1* | 3/2019 | Dewey ................ H01L 29/4236 |

\* cited by examiner

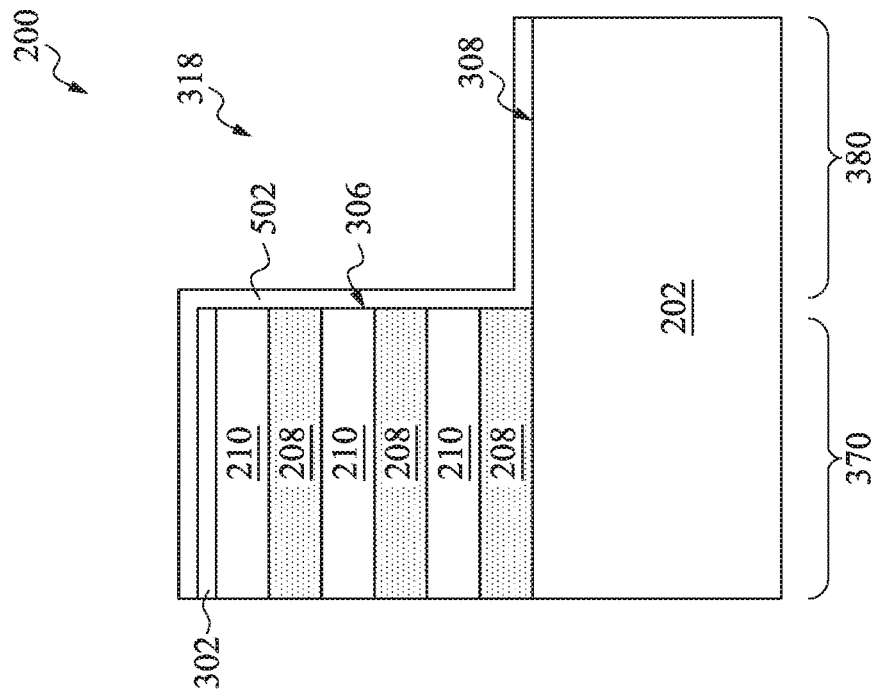
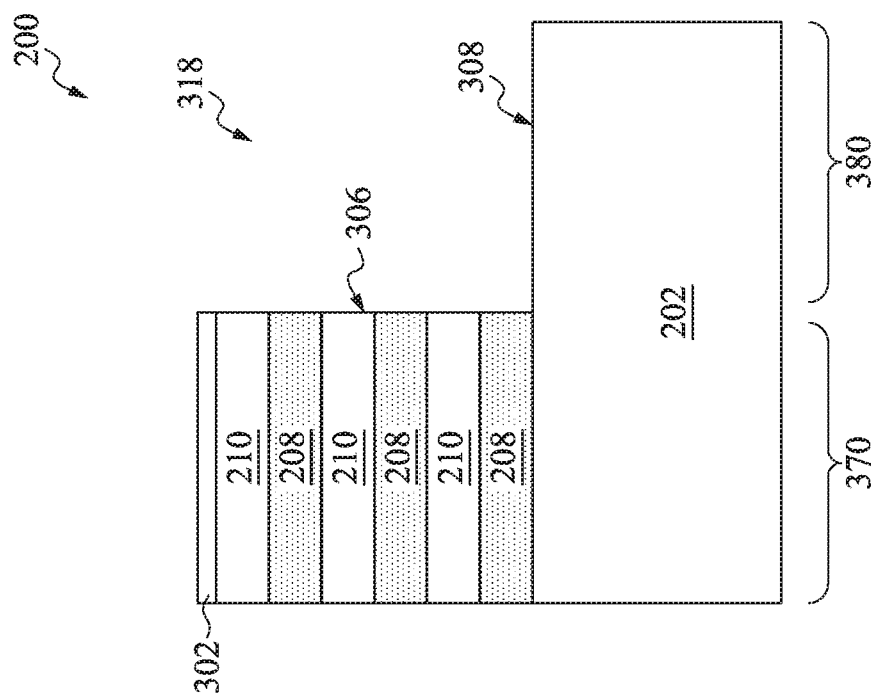

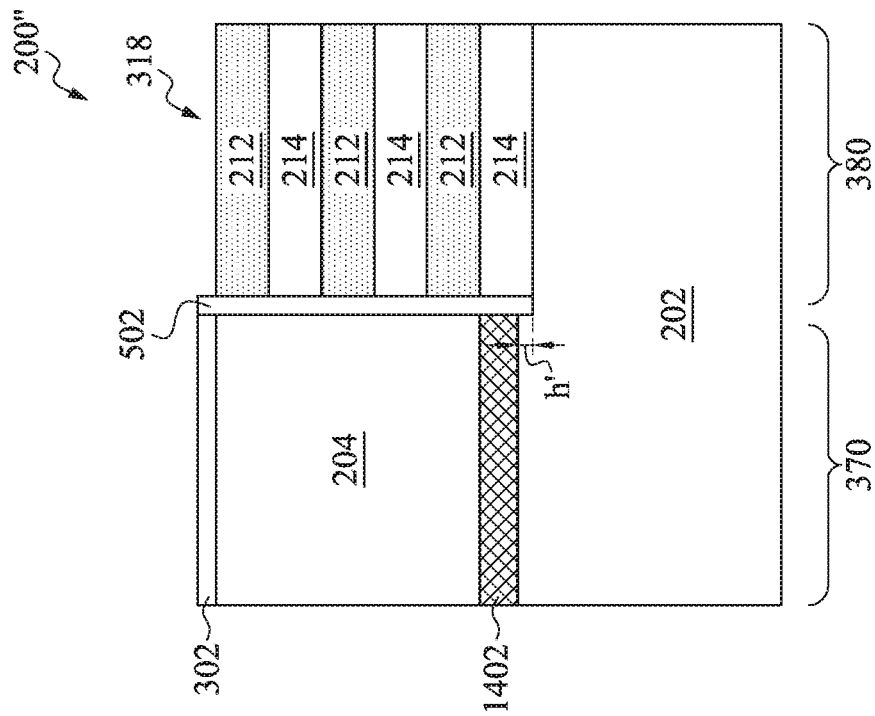
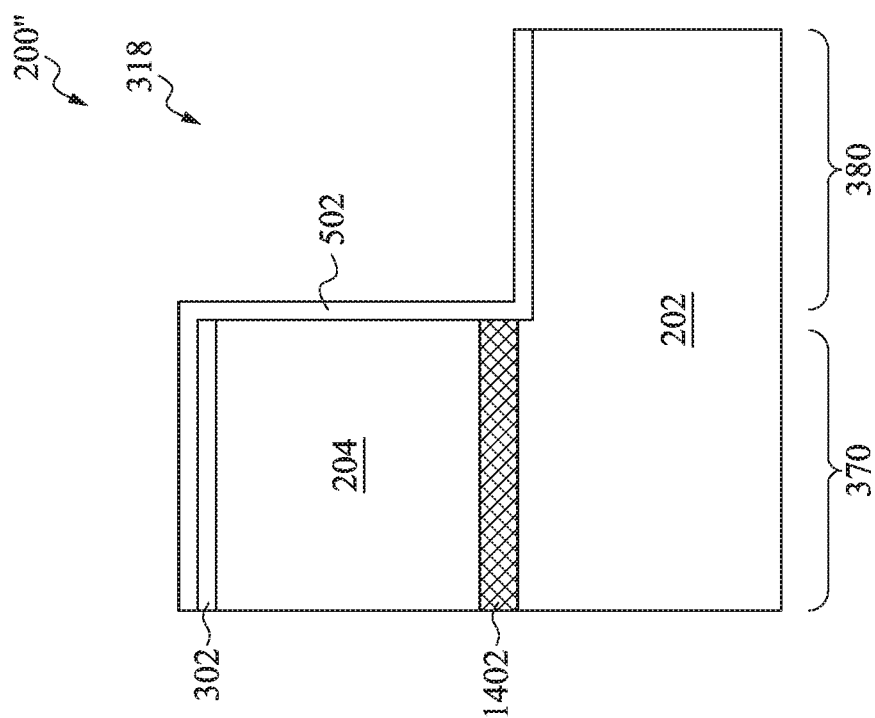

ISOLATION MANUFACTURING METHOD FOR SEMICONDUCTOR STRUCTURES

PRIORITY

This is a continuation of U.S. patent application Ser. No. 15/628,345, filed Jun. 20, 2017, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multi-gate devices have been introduced by increasing gate-channel coupling as an effort to improve gate control, reduce OFF-state current, and reduce short-channel effects (SCEs). One such multi-gate device is horizontal gate-all-around (HGAA) transistor, whose gate structure extends around its horizontal channel region providing access to the channel region on all sides. The HGAA transistors are compatible with conventional complementary metal-oxide-semiconductor (CMOS) processes, allowing them to be aggressively scaled down while maintaining gate control and mitigating SCEs. However, fabrication of the HGAA transistors can be challenging. For example, channel formation by epitaxially growing stacked semiconductor materials for HGAA transistors by the current methods is not satisfactory in all respects, especially when the device pitch is small, such as 40 nanometers (nm) or smaller.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7, 8, 9, 10, 11A, and 11B are cross-sectional and perspective views of a semiconductor device, at various fabrication stages, constructed according to the method in FIG. 1, in accordance with some embodiments.

FIGS. 14A, 14B, 14C-1, 14C-2, 14D, 14E, 14F, 14G, 14H-1, 14H-2, 14I, and 14J are perspective and cross-sectional views of a semiconductor device formed by bonding two semiconductor substrates, at various fabrication stages, constructed according to the method in FIG. 1, in accordance with some embodiments.

DETAILED DESCRIPTION

Figure 1:
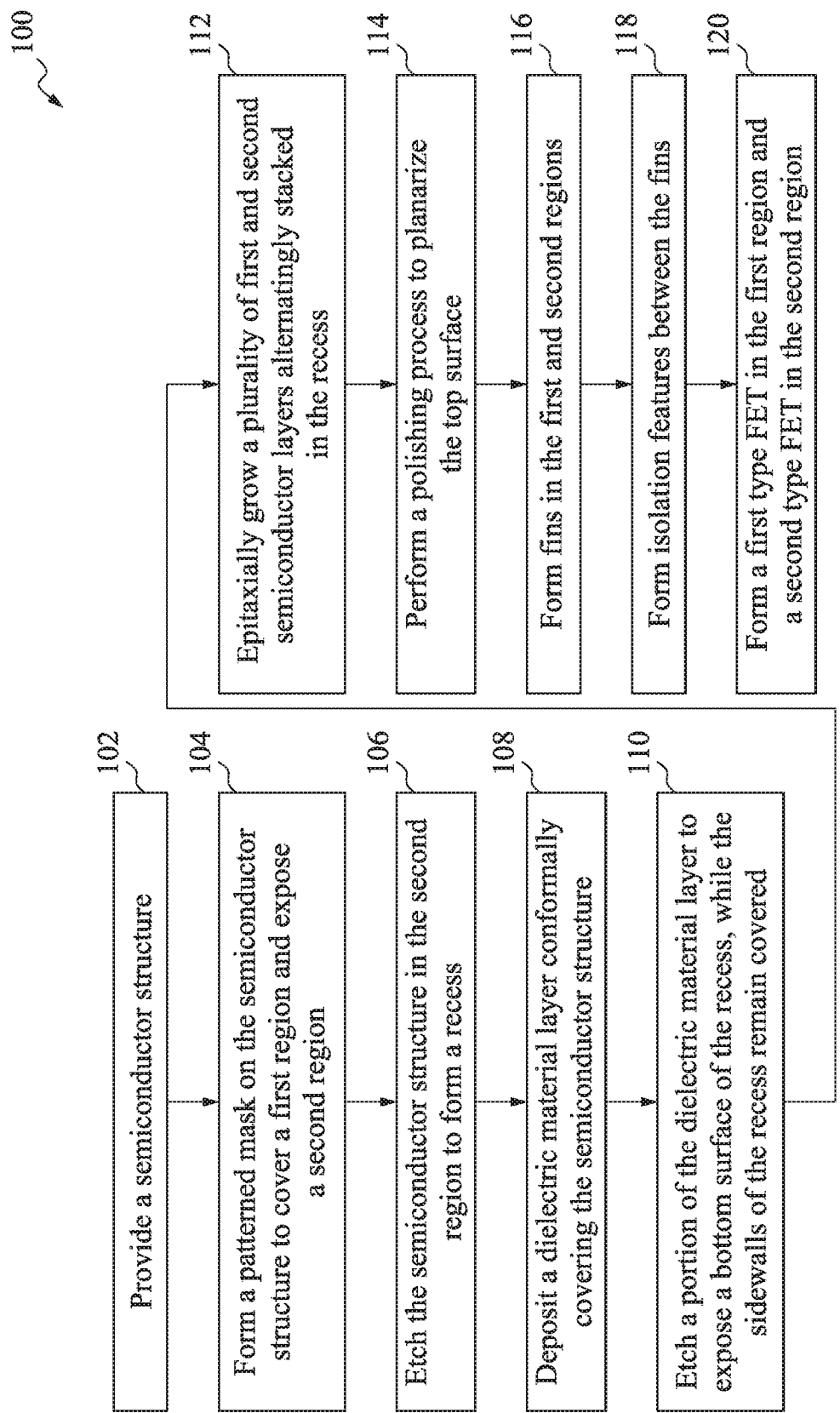
FIG. 1 is a flowchart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to the formation of gate-all-around (GAA) devices. A GAA device includes any device that has its gate structure, or portions thereof, formed on four-sides of a channel region (e.g., surrounding a portion of a channel region). The channel region of a GAA device may include nanowire channels, bar-shaped channels, and/or other suitable channel configurations. In embodiments, the channel region of a GAA device may have multiple horizontal nanowires or horizontal bars vertically spaced, making the GAA device a stacked horizontal GAA (S-HGAA) device. The GAA devices presented herein may include p-type metal-oxide-semiconductor GAA devices or n-type metal-oxide-semiconductor GAA devices. Further, the GAA devices may have one or more channel regions (e.g., nanowires) associated with a single, contiguous gate structure, or multiple gate structures. One of ordinary skill may recognize other examples of semiconductor devices that may benefit from aspects of the present disclosure.

FIG. 1 is a flowchart of a method 100 of forming a semiconductor device 200, according to various aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. Some embodiments of method 100 are described below in conjunction with FIGS. 2-11B and the semiconductor structure 200. Following this discussion, additional embodiments of the method 100 are described with reference to exemplary embodiment of semiconductor structure 200' in FIGS. 13A-13D and exemplary embodiments of the semiconductor structure 200" in FIGS. 14A-14J.

Figure 2:
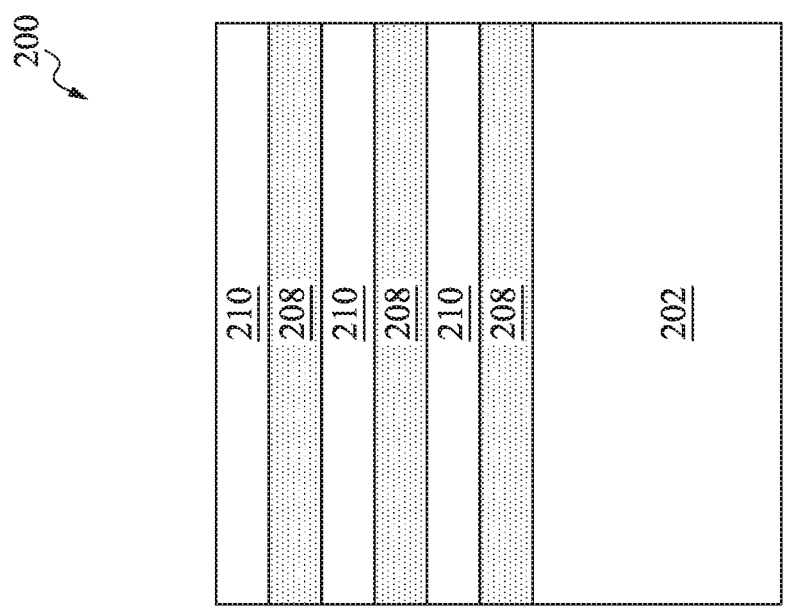
Figure 12:
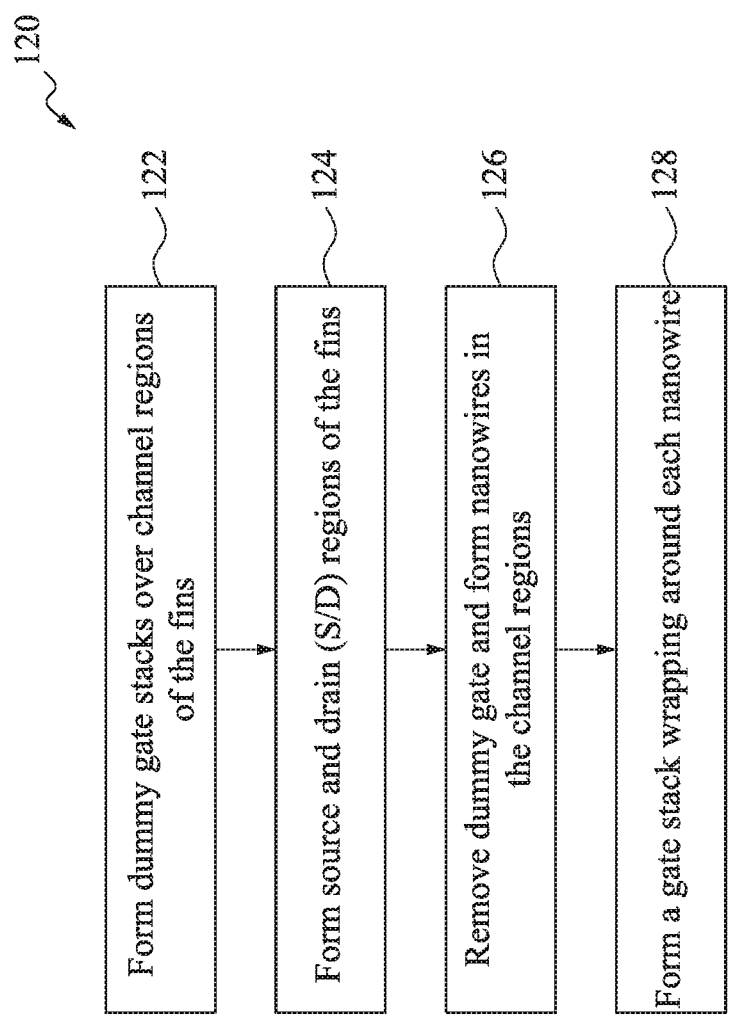
FIG. 12 is a flowchart of a method of forming field effect transistors (FETs).
Figure 13B:
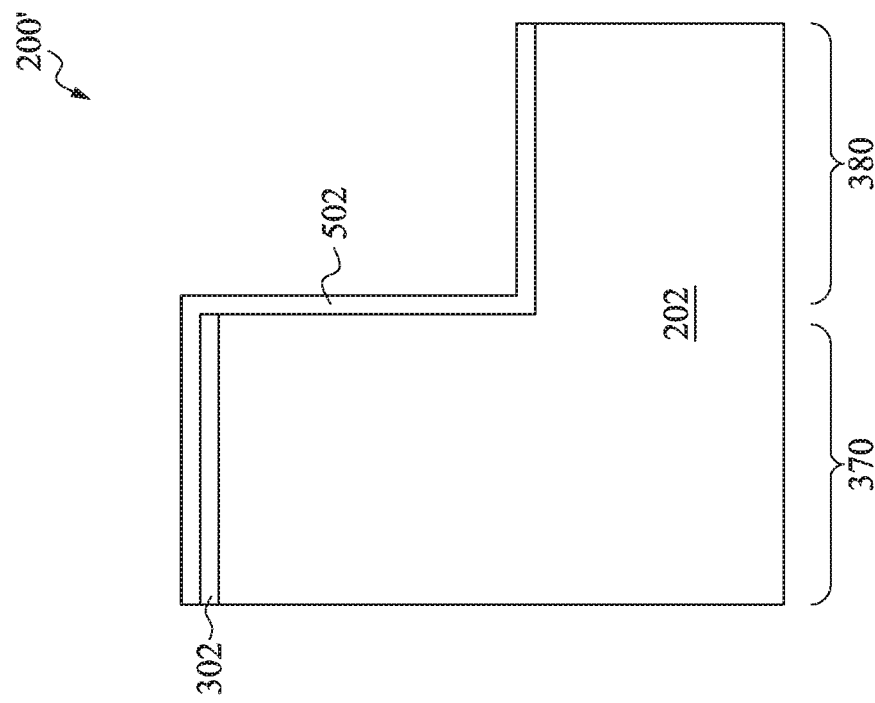
FIGS. 13A, 13B, 13C, and 13D are cross-sectional views of a semiconductor device, at various fabrication stages, constructed according to the method in FIG. 1, in accordance with some embodiments.
Figure 13A:
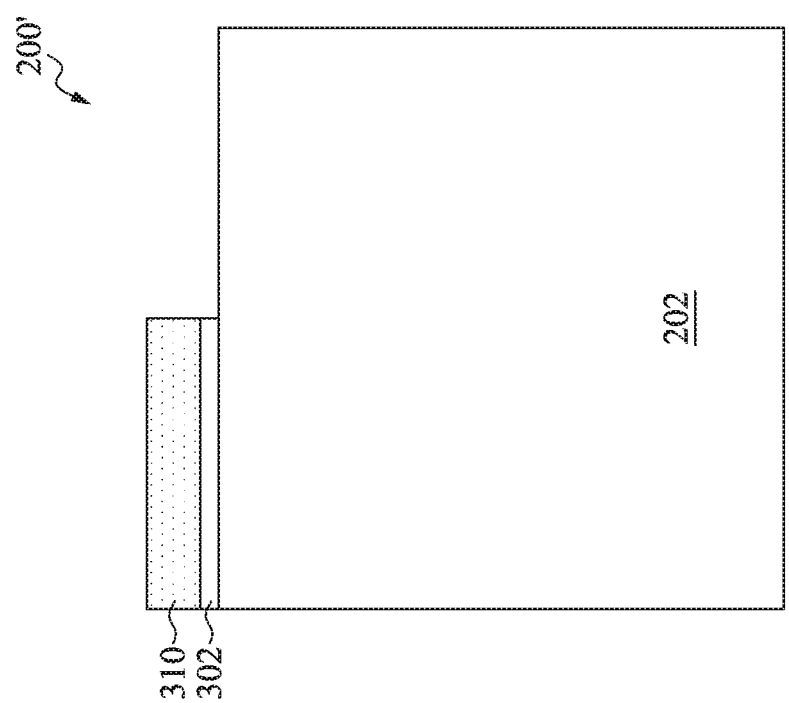
Figure 13D:
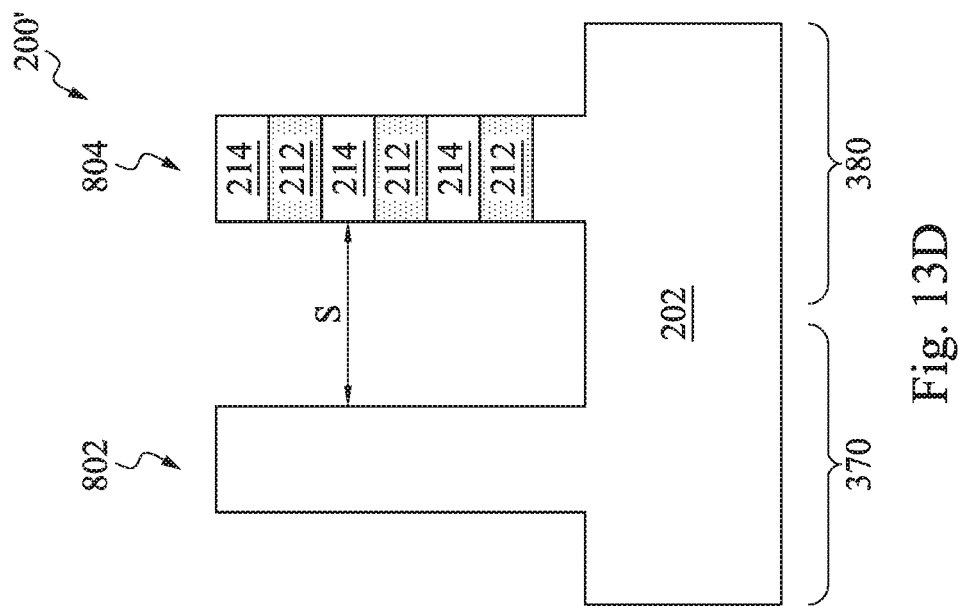
Figure 13C:
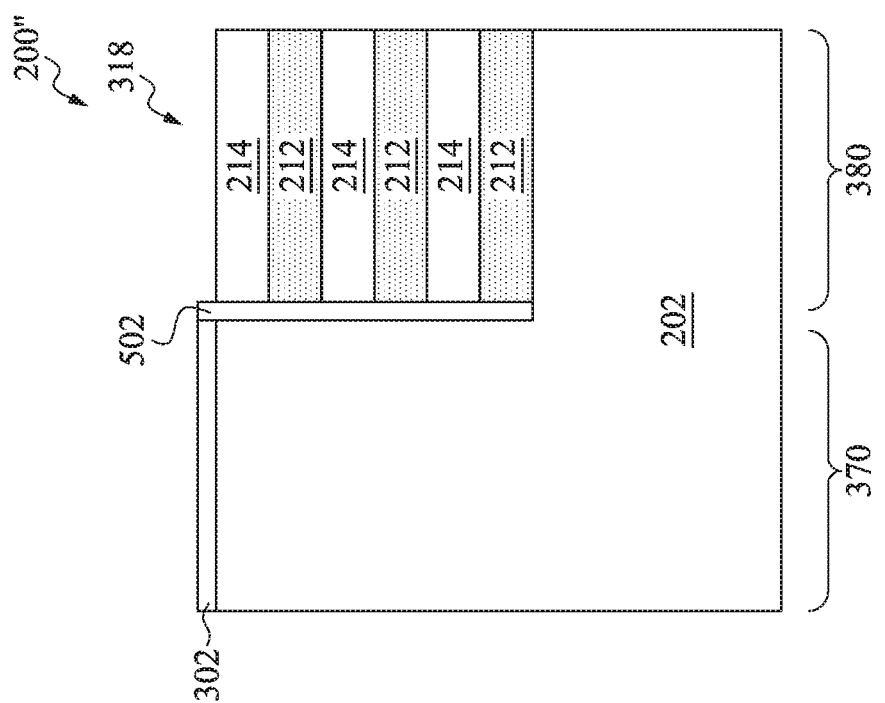

At operation 102, the method 100 (FIG. 1) provides a semiconductor structure 200. The semiconductor structure 200 may include different features in various embodiments. In one embodiment, the semiconductor structure 200 includes a substrate 202 and a stack of alternatingly disposed semiconductor layers 208 and 210 (FIG. 2). In another embodiment, the semiconductor structure 200' includes a bulk semiconductor substrate 202 (FIG. 13A). In yet another embodiment, the semiconductor structure 200" includes a stack of two semiconductor substrates 202 and 204 (FIG. 14C-1). The semiconductor structure 200 is provided for illustration purposes and does not necessarily limit the embodiments of the present disclosure to any number of devices, any number of regions, or any configuration of structures or regions. Furthermore, the semiconductor structures as shown in FIGS. 2-14J may be intermediate devices fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Referring to FIG. 2, in the present embodiment, the semiconductor structure 200 includes a substrate 202 and a stack of semiconductor layers 208 and 210 in an interleaving or alternating fashion (e.g., a layer 210 disposed over a layer 208, then another layer 208 disposed over the layer 210, so on and so forth). In embodiments, the substrate 202 may be a semiconductor substrate such as a silicon substrate. The substrate 202 may include various layers, including conductive or insulating layers formed on a semiconductor substrate. The substrate 202 may include various doping configurations. For example, different doping profiles (e.g., n wells, p wells) may be formed on the substrate 202 in regions designed for different device types (e.g., n-type field effect transistors (NFET), p-type field effect transistors (PFET)). The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer, may be strained for performance enhancement, may include a silicon-on-insulator structure, and/or have other suitable enhancement features.

Still referring to FIG. 2, the semiconductor layers 208 and 210 are alternatingly disposed in a vertical direction, forming a stack. In various embodiments, the stack may include any number of alternately disposed semiconductor layers 208 and 210. The semiconductor layers 208 and 210 may have different thicknesses. The semiconductor layers 208 may have different thicknesses from one layer to another layer. The semiconductor layers 210 may have different thicknesses from one layer to another layer. The thickness of each of the semiconductor layers 208 and 210 may range from few nanometers to few tens of nanometers. It is understood that although FIG. 2 illustrates a layer 208 as the bottom layer of the stack, a layer 210 may be the bottom layer as well. The first layer of the stack may be thicker than other semiconductor layers 208 and 210. In an embodiment, each semiconductor layer 208 has a thickness ranging from about 5 nm to about 20 nm, and each semiconductor layer 210 has a thickness ranging from about 5 nm to about 20 nm.

The two semiconductor layers 208 and 210 have different compositions. In various embodiments, the two semiconductor layers 208 and 210 have compositions that provide for different oxidation rates and/or different etch selectivity between the layers. In an embodiment, the semiconductor layers 208 include silicon germanium ($Si_{1-x}Ge_x$), and the semiconductor layers 210 include silicon (Si). In an embodiment, the layer 210 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layer 210 (e.g., of silicon). Alternatively, the layer 210 may be intentionally doped. For example, the layer 210 may be silicon that is doped with a p-type dopant such as boron (B), aluminum (Al), indium (In), and gallium (Ga) for forming a p-type channel, or an n-type dopant such as phosphorus (P), arsenic (As), antimony (Sb), for forming an n-type channel. In some embodiments, the layer 208 is $Si_{1-x}Ge_x$ that includes less than 50% (x<0.5) Ge in molar ratio. For example, Ge may comprise about 15% to 35% of the layer 208 of $Si_{1-x}Ge_x$ in molar ratio. Furthermore, the semiconductor layers 208 may include different compositions among them, and the semiconductor layers 210 may include different compositions among them.

In various embodiments, either of the semiconductor layers 208 and 210 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 208 and 210 may be chosen based on providing differing oxidation rates and/or etch selectivity. The semiconductor layers 208 and 210 may be doped or undoped, as discussed above.

In various embodiments, the semiconductor layers 208 and 210 are epitaxially grown from the top surface of the substrate 202. For example, each of the semiconductor layers 208 and 210 may be grown by a molecular beam epitaxy (MBE) process, a chemical vapor deposition (CVD) process such as a metal organic CVD (MOCVD) process, and/or other suitable epitaxial growth processes. During the epitaxial growth, the crystalline structure of the substrate 202 extends upwardly, resulting in the semiconductor layers 208 and 210 having the same crystal orientation with the substrate 202.

In crystalline semiconductor materials, the atoms which make up the solid are arranged in a periodic fashion. If the periodic arrangement exists throughout the solid, the substance is defined as being formed of a crystal. The periodic arrangement of atoms in a crystal is commonly called "the crystal lattice." The crystal lattice also contains a volume which is representative of the entire lattice and is referred to as a unit cell that is regularly repeated throughout the crystal. For example, silicon has a diamond cubic lattice structure, which can be represented as two interpenetrating face-centered cubic lattices. Thus, the simplicity of analyzing and visualizing cubic lattices can be extended to the characterization of silicon crystals. In the description herein, references to various planes in semiconductor crystals (e.g., silicon crystals) will be made, especially to the (100), (110), and (111) planes. These planes define the orientation of the plane of semiconductor atoms relative to the principle crystalline axes. The numbers (xyz) are referred to as Miller indices and are determined from the reciprocals of the points at which the crystal plane of silicon intersects the principle crystalline axes.

In the present embodiment, the crystalline structure of the silicon substrate 202 has a top surface in a (100) crystal plane. Accordingly, the semiconductor layers 208 and 210 each has a top surface on the same (100) crystal plane. In various other embodiments, the silicon substrate 202 may have a top surface in one of crystal planes different from a (100) crystal plane, such as in a (110) crystal plane. Accordingly, the semiconductor layers 208 and 210 keep in the same crystalline structure and exhibit the same (110) crystal plane in the top surface. After the epitaxial growth, a chemical mechanical planarization (CMP) process may be performed to planarize a top surface of the semiconductor structure 200.

Figure 3:
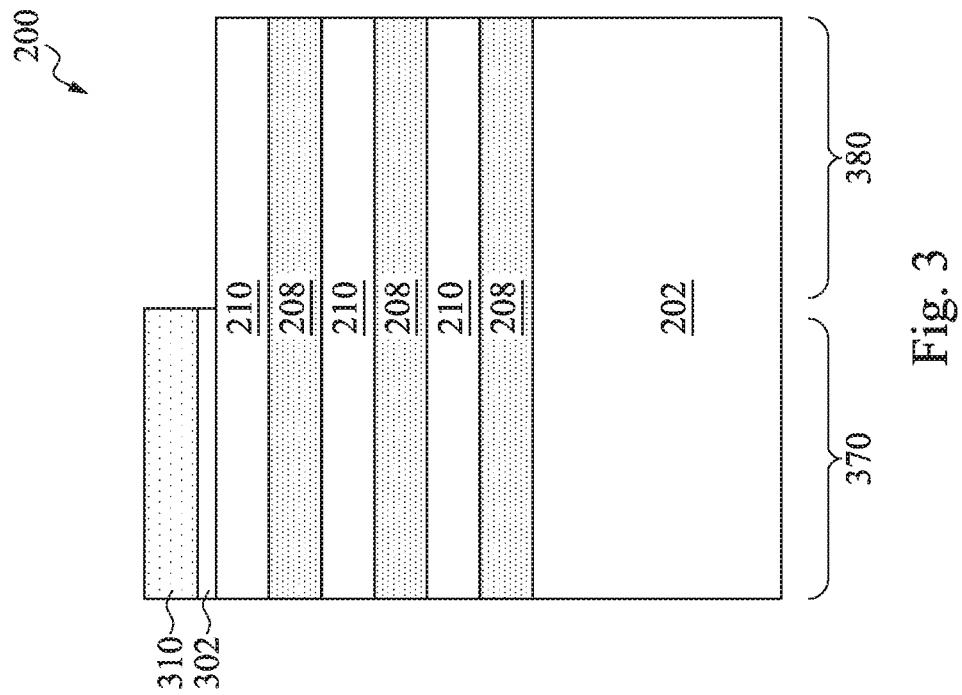

At operation 104, the method 100 (FIG. 1) forms a patterned mask on the top surface of the semiconductor device 200. Referring to FIG. 3, the patterned mask covers a first region 370 and includes an opening that exposes a second region 380 of the semiconductor device 200. In an embodiment, the first region 370 is a region of the substrate 202 defined for one or more n-type field effect transistor(s) (FET) and the second region 380 is a region of the substrate 202 defined for one or more p-type FET(s). It is understood that the semiconductor device 200 may alternatively have a p-type FET form in the region 370 and an n-type FET to form in the region 380. The patterned mask may be a soft mask such as a patterned resist layer, or a hard mask such as a dielectric material layer, or a combination thereof. In one embodiment, the patterned mask includes a hard mask 302 disposed on the region 370 and a patterned resist layer 310 formed on the hard mask 302 by a lithography process. The hard mask 302 is etched to transfer the opening from the patterned resist layer 310 to the hard mask 302. In some examples, the hard mask 302 includes silicon oxide, silicon nitride, silicon oxynitride, silicon carbide, silicon carbide nitride, silicon carbide oxynitride, other semiconductor material, and/or other dielectric material. In an embodiment, the hard mask 302 has a thickness ranging from about 1 nm to about 40 nm. The hard mask 302 may be formed by thermal oxidation, chemical vapor deposition (CVD), atomic layer deposition (ALD), or any other appropriate method. An exemplary photolithography process may include forming a resist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing. In some embodiments, the patterned resist layer 310 may be directly used as an etch mask for the subsequent etch process. The patterned resist layer 310 may be removed by a suitable process, such as wet stripping or plasma ashing, after the patterning of the hard mask 302.

At operation 106, the method 100 (FIG. 1) etches the stack of semiconductor layers 208 and 210 in the second region 380 until the substrate 202 is exposed, resulting in a recess 318. Referring to FIG. 4, the etching process is designed to selectively remove the semiconductor layers 208 and 210 in the second region 380 using the hard mask 302 as an etch mask. The etching process may further continue to recess the substrate 202 to ensure a top surface portion 308 of the substrate 202 is exposed in the recess 318. A sidewall 306 of the etched stack of semiconductor layers 208 and 210 is also exposed defining an edge of the recess 318. The etching process may include dry etch, wet etch, or a combination thereof. The patterned mask 302 protects the stack of semiconductor layers 208 and 210 within the first region 370 from etching. In various examples, the etching process may include a dry etch with a suitable etchant, such as fluorine-containing etching gas or chlorine-containing etching gas, such as $Cl_2$, $CCl_2F_2$, $CF_4$, $SF_6$, $NF_3$, $CH_2F_2$ or other suitable etching gas. In some other examples, the etching process may include a wet etch with a suitable etchant, such as a hydrofluoric acid (HF) based solution, a sulfuric acid ($H_2SO_4$) based solution, a hydrochloric (HCl) acid based solution, an ammonium hydroxide ($NH_4OH$) based solution, other suitable etching solution, or combinations thereof. The etching process may include more than one step.

At operation 108, the method 100 (FIG. 1) forms a dielectric material layer 502 conformally covering the semiconductor structure 200. As shown in FIG. 5, the dielectric material layer 502 is deposited as a blanket layer. In an embodiment, the dielectric material layer 502 has a thickness ranging from about 1 nm to about 40 nm. The dielectric material layer 502 may include semiconductor oxide, semiconductor nitride, semiconductor oxynitride, semiconductor carbide nitride, semiconductor carbide oxynitride, and metal oxide, such as hafnium oxide, zirconium oxide, and aluminum oxide, other dielectric, and/or other suitable material and may be selected to have different etch selectivity from the hard mask 302. In an example, the hard mask 302 includes silicon oxide and the dielectric material layer 502 includes silicon nitride. In another example, the hard mask 302 includes silicon oxynitride and the dielectric material layer 502 includes aluminum oxide. In yet another example, the hard mask 302 includes silicon carbide oxynitride and the dielectric material layer 502 includes zirconium oxide. The dielectric material layer 502 may be deposited on the hard mask 302, the sidewall 306, and the top surface portion 308 of the substrate 202 by any suitable process including atomic layer deposition (ALD), chemical vapor deposition (CVD), plasma-enhanced CVD (PECVD), or other suitable deposition techniques. Conformal deposition techniques may be used.

Figure 6B:
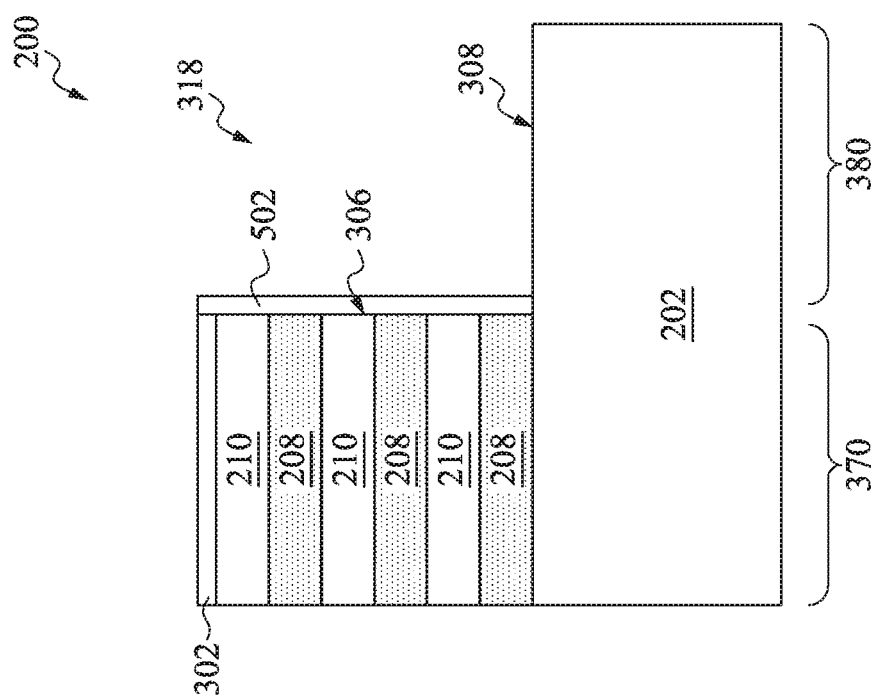
Figure 6A:
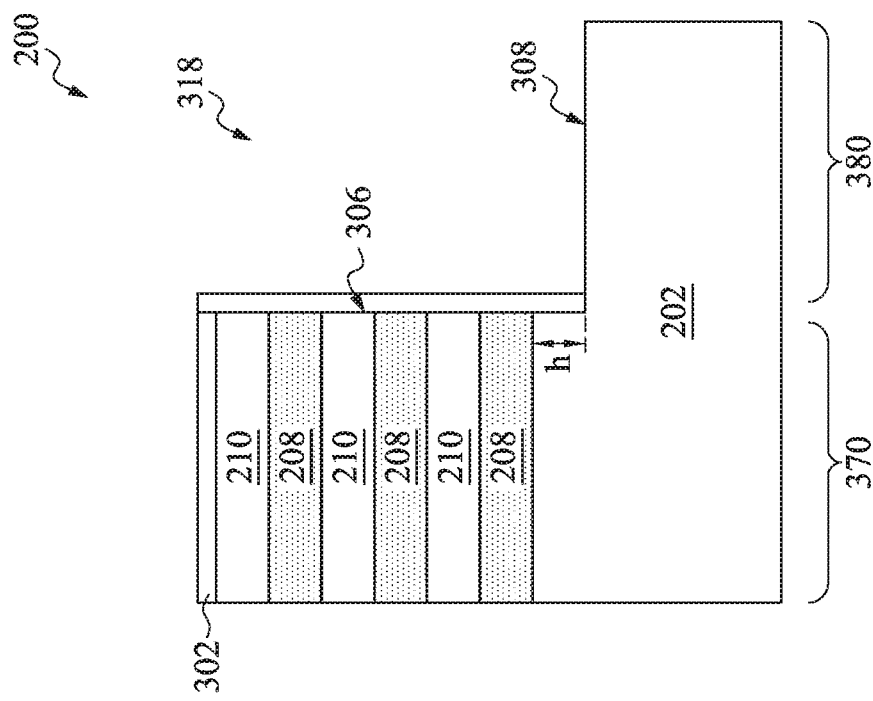
Figure 8:
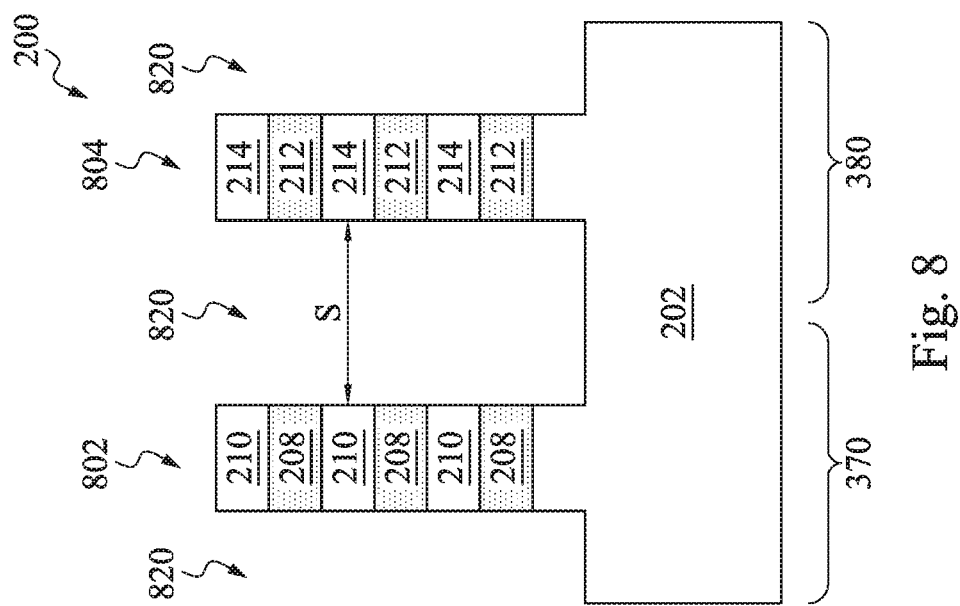

At operation 110, the method 100 (FIG. 1) removes portions of the dielectric material layer 502 deposited on the horizontal surface of the semiconductor structure 200, while the sidewall 306 of the stack of semiconductor layers 208 and 210 remains covered by the remaining portions of the dielectric material layer 502 (FIG. 6A). To perform the removal, an anisotropic etching, such as a dry or plasma etching, may be performed to etch back and remove those portions of the dielectric material 502 deposited on the horizontal surfaces of the hard mask 302 and the top surface portion 308 of the substrate 202. In this way, only those portions of the dielectric material layer 502 deposited on the sidewall 306 remain. Due to different etch sensitivity of each feature, the portion of the dielectric material layer 502 is selectively etched without etching (or without significantly etching) the hard mask 302. Various etching parameters can be tuned to etch the dielectric material layer 502, such as etchant composition, etching temperature, etching solution concentration, etching time, etching pressure, source power, RF bias voltage, RF bias power, etchant flow rate, other suitable etching parameters, or combinations thereof. In some embodiments, the thickness of the hard mask 302 is reduced about 5% to 15% after the anisotropic etching, such as from a thickness of about 40 nm down to about 35 nm. The dielectric material layer 502 deposited on the sidewall 306 may also suffer from some material loss due to the anisotropic etching. In some embodiments, the thickness of the dielectric material layer 502 is reduced about 8% to 20%, such as from a thickness of about 40 nm down to about 35 nm. In some embodiments, the top surface portion 308 may be lower than a bottom surface of the stack of semiconductor layers 208 and 210 by a height h (FIG. 6B), due to an optional over etching to further recess the substrate 202 which ensures the exposing of the substrate 202. Therefore, a bottom end of the dielectric material 502 may be lower than a bottom surface of the stack of semiconductor layers 208 and 210 by the height h. The height h may range from about 1 nm to about 40 nm. For the convenience of discussion, the semiconductor structure 200 as shown in FIG. 6A is used as an example for subsequent operations. Persons having ordinary skill in the art should recognize that the semiconductor structure 200 as shown in FIG. 6B can also be used for the subsequent operations.

Figure 7:
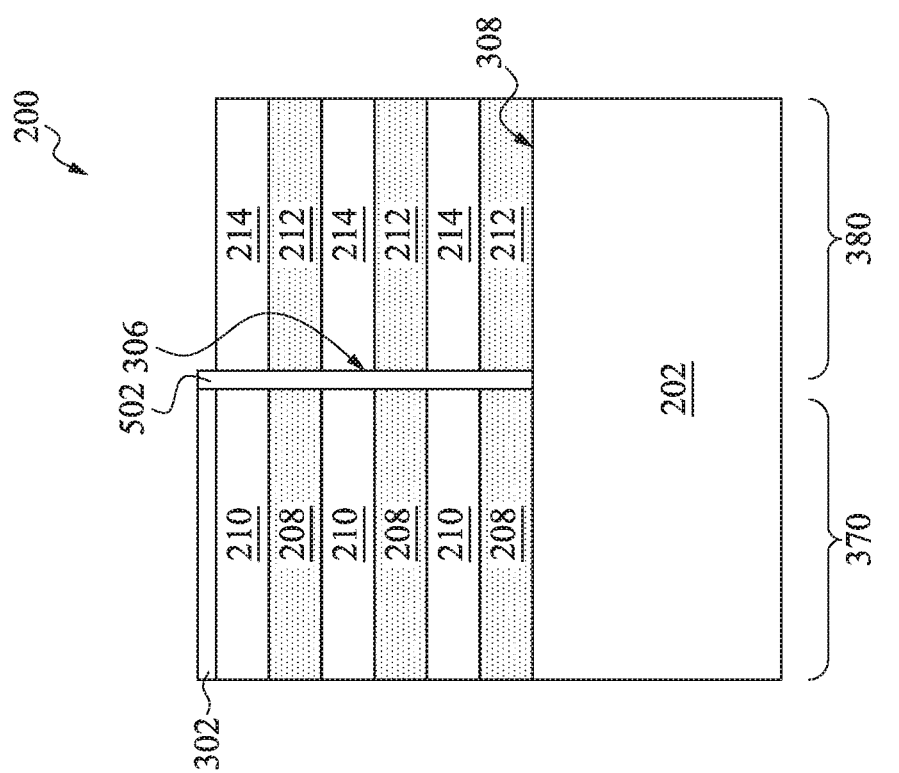

At operation 112, the method 100 (FIG. 1) forms a stack of alternatingly disposed semiconductor layers 212 and 214. Referring to FIG. 7, the semiconductor layers 212 and 214 are epitaxially grown in the recess 318. In an embodiment, the semiconductor layers 212 and 214 include similar geometrical dimensions or compositions as the discussion above related with the semiconductor layers 208 and 210. Hence, they are briefly described. The epitaxial growth in the operation 112 may include more than one step to grow multiple semiconductor layers with different semiconductor materials. Each of the semiconductor layers 212 and 214 may be grown by a molecular beam epitaxy (MBE) process, a chemical vapor deposition (CVD) process such as a metal organic CVD (MOCVD) process, and/or other suitable epitaxial growth processes. Each of the semiconductor layers 212 and 214 may include silicon, silicon germanium, or other suitable elementary semiconductor material or compound semiconductor material. In some embodiments, the two semiconductor layers 212 and 214 have different compositions than one another. In various embodiments, the two semiconductor layers 212 and 214 have compositions that provide for different oxidation rates and/or different etch selectivity between the two layers. Further, the two semiconductor layers 212 and 214 may have different composition from either of the two semiconductor layers 208 and 210. In some embodiments, one of the two semiconductor layers 212 and 214 has the same composition with one of the two semiconductors 208 and 210. For example, in an embodiment, the semiconductor layer 214 includes the same composition as the semiconductor layer 210 (e.g., including silicon). In an embodiment, the semiconductor layer 212 includes $Si_{1-y}Ge_y$, and the semiconductor layer 208 includes $Si_{1-x}Ge_x$. In a further embodiment, the layer 212 includes $Si_{1-y}Ge_y$, where Ge is in higher molar ration than the $Si_{1-x}Ge_x$ composition of layer 208 (y>x). For example, the layer 212 of $Si_{1-y}Ge_y$ may include more than 50% (y>0.5) Ge in molar ratio, such as about 50% to 70% Ge in the layer 212, while the layer 208 of $Si_{1-x}Ge_x$ includes less than 50% (x<0.5) Ge in molar ratio, such as about 15% to 35% Ge in the layer 208.

The semiconductor layers 212 and 214 may have different thicknesses. The semiconductor layers 212 may have different thicknesses from one layer to another layer. The semiconductor layers 214 may have different thicknesses from one layer to another layer. The thickness of each of the semiconductor layers 212 and 214 may range from a few nanometers to a few tens of nanometers. In an embodiment, each semiconductor layer 212 has a thickness ranging from about 5 nm to about 20 nm, and each semiconductor layer 214 has a thickness ranging from about 5 nm to about 20 nm. It is understood that although FIG. 7 illustrates a semiconductor layer 212 as the bottom layer of the stack, a semiconductor layer 214 may be the bottom layer as well.

In the first region 370, the hard mask 302 functions as a capping layer on the top surface of the stack of semiconductor layers 208 and 210, blocking epitaxial growth from taking place on a top surface in the first region 370. While in the second region 380, the dielectric material layer 502 covers the sidewall 306 thereby blocking epitaxial growth from originating from the sidewall 306 so that the epitaxially growth does not take place in lateral direction from the sidewall 306 into the second region 380. Therefore, in some embodiments, the epitaxial growth of the semiconductor layers 212 and 214 are limited from the top surface portion 308 of the substrate 202. The crystalline structure of the substrate 202 only has its crystal plane on the top surface to extend upwardly in the second region 380, resulting in the semiconductor layers 212 and 214 having the same crystal orientation as the substrate 202. Due to the isolation from the dielectric material layer 502, the epitaxially grown semiconductor layers in the first region 370, the second region 380, and the substrate 202, exhibit the same crystal orientation. In an embodiment, each of the semiconductor layers 208, 210, 212, 214, and the substrate 202, has a top surface on the (100) crystal plane.

At operation 114, the method 100 (FIG. 1) performs a CMP process to planarize a top surface of the semiconductor structure 200 after the epitaxial growth of the semiconductor layers 212 and 214. Still referring to FIG. 7, the hard mask 302 can function as a CMP stop layer at operation 114. The operation 114 can also remove the hard mask layer 302. As a result, the stack of the semiconductor layers 208 and 210 is exposed to form part of the top surface of the semiconductor structure 200.

At operation 116, the method 100 (FIG. 1) patterns the semiconductor structure 200 to form one or more fins extending from the substrate 202 and each fin includes a stack of semiconductor layers. Referring to the example of FIG. 8, in the illustrated embodiment, the semiconductor structure 200 includes a fin 802 in the first region 370, which includes a stack of semiconductor layers 208 and 210, and a fin 804 in the second region 380, which includes a stack of semiconductor layers 212 and 214. Providing two fins is for ease of illustration and any number of fins may be formed. The two fins 802 and 804 are spaced by a distance annotated as spacing S. In some embodiments, the spacing S is in a range from about 5 nm to about 60 nm. In furtherance of some embodiments, the spacing S is in a range from about 15 nm to about 40 nm, for tight device integration.

The operation 116 may include a variety of processes such as photolithography and etching. First, the operation 116 forms a masking element over the semiconductor structure 200 through a photolithography process. The photolithography process may include forming a photoresist (or resist) over the semiconductor structure 200, exposing the resist to a pattern that defines various geometrical shapes, performing post-exposure bake processes, and developing the resist to form the masking element. Subsequently, the operation 116 etches the semiconductor layers 208 and 210 in the first region 370 and the semiconductor layers 212 and 214 in the second region 380 through the masking element to form trenches 820 therein. The etching processes may include one or more dry etching processes, wet etching processes, and other suitable etching techniques. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The remaining portions of the semiconductor layers become the fins 802 and 804, defining the trenches 820 surrounding the fins 802 and 804. The etching process may further continue to recess into the substrate 202. In some embodiments, the etching process may be desired to overetch into the substrate 202 to ensure the substrate 202 is exposed throughout the trenches 820.

Embodiments of the present disclosure provide advantages over other methods in forming multiple regions of stacked semiconductor layers. As shown in FIG. 7, the dielectric material layer 502 provides lateral isolation between the regions 370 and 380, allowing the stack of semiconductor layers 212 and 214 to epitaxially grow from a crystal plane defined by the top surface of the substrate 202. Without lateral isolation between the regions 370 and 380, epitaxial growth may occur from the sidewall 306 of the stack of semiconductor layers 208 and 210. Epitaxial growth from the sidewall 306 would provide a growth in a lateral direction in a crystal plane perpendicular to the crystal plane of the top surface of the substrate 202. The growth of a vertical semiconductor plane laterally results in vertically stacked semiconductor layers in the region adjacent the exposed sidewall. Thus, without lateral isolation (e.g., dielectric layer 502), epitaxial layers grown in the second region would include different crystal planes (e.g., a horizontal portion in a (100) crystal plane mixed with a vertical portion in a (110) crystal plane). The regions of vertically grown material on a sidewall would extend a certain distance before meeting the horizontal portions of the stack, thereby forming a "turning region." The thickness of the turning region (where the epitaxy is grown from the sidewall) is roughly equal to the height of the stack grown. The turning region is not suitable to form fins herein, and thus, becomes a lost area on the substrate and results in wider spacing between fins. Thus, providing a lateral isolation on the sidewall as described in some embodiments of the present disclosure, as a result of the isolation manufacturing between the regions 370 and 380, can provide a smaller spacing (e.g., the spacing S between two adjacent fins 802 and 804) between fins, which advantageously increases the integration of the semiconductor device.

Figure 9:
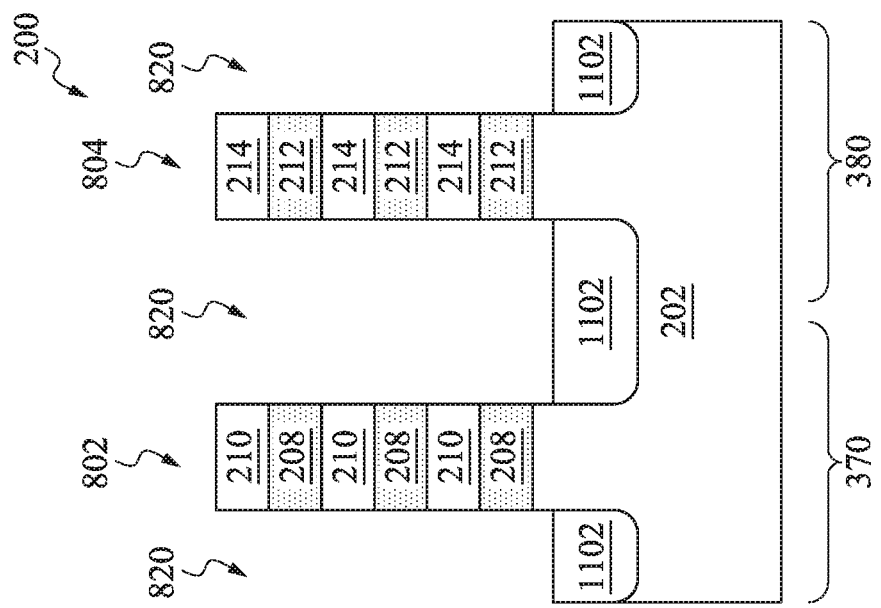

At operation 118, the method 100 (FIG. 1) forms isolation features 1102 between the fins 802 and 804. Referring to FIG. 9, the isolation features 1102 may be formed of silicon oxide, silicon nitride, silicon oxynitride, fluoride-doped silicate glass, a low-k dielectric material, and/or other suitable insulating material. The isolation features 1102 may be shallow trench isolation (STI) features. The operation 118 may include a variety of processes such as deposition and etching. In some embodiments, the operation 118 of the method 100 deposits a dielectric material, such as silicon oxide, into the trenches 820. The dielectric material may be formed by chemical vapor deposition (CVD), plasma enhanced CVD (PECVD), physical vapor deposition (PVD), thermal oxidation, or other techniques. A CMP process may be performed to planarize a top surface of the semiconductor structure 200. Thereafter, the dielectric material is recessed by selective etching to form the isolation features 1102, which isolates various portions of the substrate 202 and/or epitaxially stacks 208/220 and 212/214. The selective etching may include wet etching, dry etching, or a combination thereof to selectively etch back the isolation features 1102.

Figure 10:
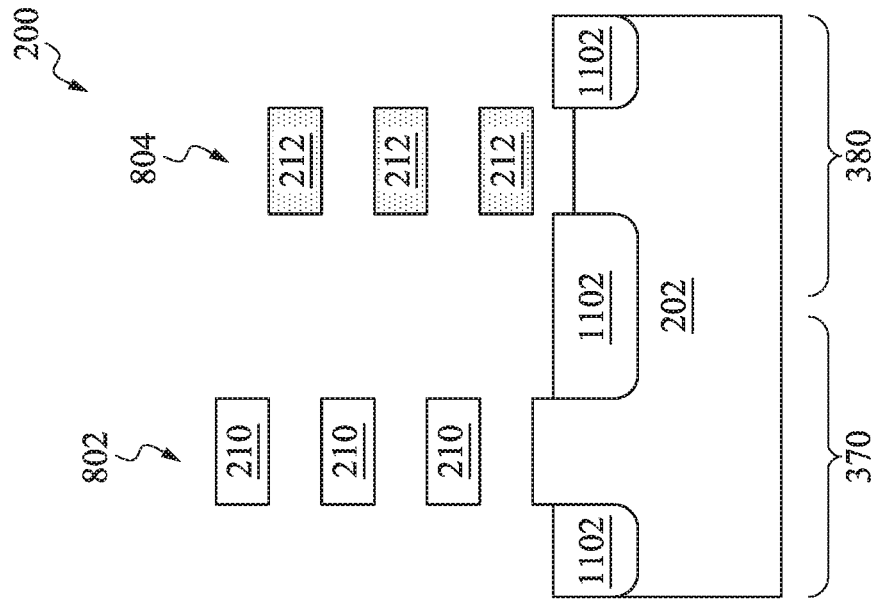

The method 100 then proceeds to operation 120 to form FETs on the fins 802 and 804. In an example, the method 100 forms n-type FET on the fin 802 within the first region 370 and p-type FET on the fin 804 within the second region 380. As shown in FIG. 10, in some embodiments, the operation 120 further includes forming nanowire channels (or bar-shaped channels) in the FETs. The nanowire formation includes a selective etching process to selectively remove one semiconductor layer from the respective channel region (or channel and source/drain regions) of the FETs. In an embodiment, the layers 208 (e.g., $Si_{1-x}Ge_x$) are removed from the channel region of the fin 802 while the layers 210 (e.g., Si) remain as the channel of the n-type FET; the layers 214 (e.g., Si) are removed from the channel region of the fin 804 while the layers 212 (e.g., $Si_{1-y}Ge_y$) remain as the channel of the p-type FET. The operation 120 may further include forming a gate stack on the fin and such that it fills the opening provided by the removal certain semiconductor layers as discussed above. The gate stack can wrap around each of the channel semiconductor layers in each respective FET. Since gate stacks wrap around the vertically-stacked horizontally-oriented channel semiconductor layers, the semiconductor structure 200 is referred to as a stacked horizontal gate-all-around (S-HGAA) device.

Figure 11B:
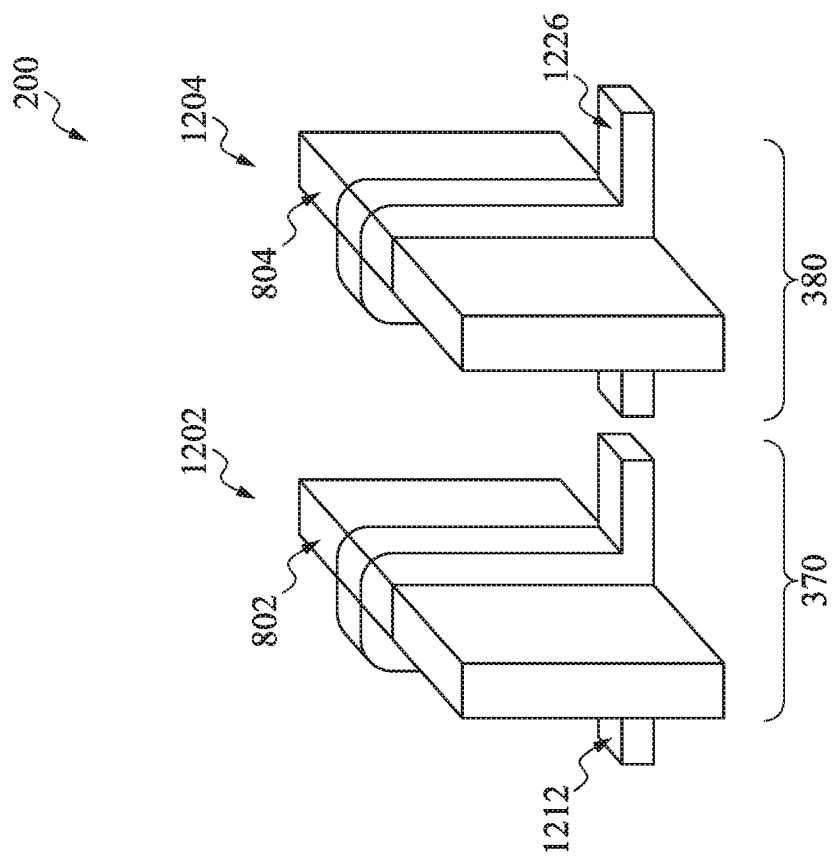
Figure 11A:
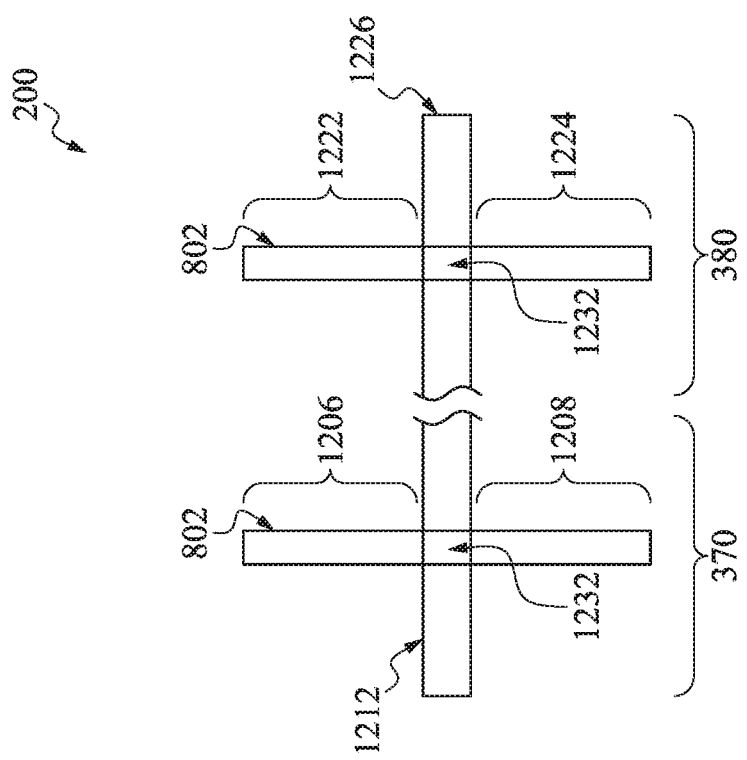

Illustrated in FIGS. 11A and 11B, an exemplary n-type FET 1202 and an exemplary p-type FET 1204 are formed on the fins 802 and 804, respectively. FIG. 11A is a top view and FIG. 11B is a perspective view of the semiconductor structure 200 in accordance with some embodiments. Specifically, the n-type FET 1202 includes source/drain (S/D) regions 1206 and 1208, and a gate 1212 interposed between the S/D regions 1206 and 1208. Similarly, the p-type FET 1204 includes S/D regions 1222 and 1224, and a gate 1226 interposed between the S/D regions 1222 and 1224. One or more FETs may be formed on each fin feature. The channel for each FET is defined in the portion of the corresponding fin that interposed between the source and drain, and is underlying the gate. In the present embodiment, the n-type FET 1202 has a first channel 1232 in the fin 802 and the p-type FET 1204 has a second channel 1234 in the fin 804. For the n-type FET 1202, the carriers (electrons) flow through the channel 1232 along the stacked silicon nanowire or bar-shaped channels (e.g., Si layers 210). For the p-type FET 1204, the carriers (holes) flow through the channel 1234 along the silicon germanium nanowire or bar-shaped channels (e.g., $Si_{1-y}Ge_y$ layers 212). By providing the semiconductor structure 200 having n-type FETs and p-type FETs with respective channel material compositions, the carrier mobility for both are enhanced and device performance is improved.

The formation of the FETs is further described below. Referring to FIGS. 1 and 12, operation 120 includes various procedures and sub-operations, such as operations 122, 124, 126, and 128 illustrated in FIG. 12. At operation 122, in some embodiments, the method 100 forms gate stacks over the fins 802 and 804, respectively. In an embodiment, the gate stacks will be removed in a later gate-replacement process. Hence, it is referred to as the dummy gate stacks. The dummy gate stacks engage the fins at the channel regions 1232 and 1234. The dummy gate stack may include single or multiple layers of materials. In the present embodiment, the dummy gate stacks include a polysilicon (or poly) layer. In an embodiment, the dummy gate stacks further include an interfacial layer (e.g., silicon oxide) underneath the poly layer. The poly layer may be formed by suitable deposition processes such as low-pressure chemical vapor deposition (LPCVD) and PECVD. In an embodiment, the various layers of the dummy gate stack are first deposited as blanket layers, and then patterned with one or more photolithography and etching processes to form the dummy gate stacks. A gate spacer may be formed on sidewalls on the dummy gate stacks after the dummy gate stacks are patterned. The gate spacer may include one or more dielectric materials such as silicon nitride, silicon oxide, silicon carbide, silicon oxycarbide (SiOC), silicon oxycarbon nitride (SiOCN), other materials, or a combination thereof. The gate spacer may be formed by depositing a spacer layer blanketing the semiconductor structure 200 with suitable methods, such as chemical oxidation, thermal oxidation, ALD, or CVD, then etching the spacer layer by an anisotropic etching process to remove portions of the spacer layer from a top surface of the dummy gate stacks and from top and sidewall surfaces of the fins (e.g., fins 802 and 804). Portions of the spacer layer on the sidewall surfaces of the dummy gate stacks substantially remain and become the gate spacer. In an embodiment, the anisotropic etching process is a dry (e.g., plasma) etching process.

At operation 124, in an embodiment source/drain (S/D) regions are formed in the S/D regions 1206 and 1208 of the n-type FET 1202 and the S/D regions 1222 and 1224 of the p-type FET 1204. In an embodiment, forming the S/D regions includes epitaxially growing a semiconductor layer to form S/D features. In an embodiment, the semiconductor layer is grown by a molecular beam epitaxy (MBE) process, a chemical vapor deposition process, and/or other suitable epitaxial growth processes. In a further embodiment, the S/D features are in-situ or ex-situ doped with an n-type dopant or a p-type dopant. For example, in some embodiments, the S/D features includes silicon-germanium (SiGe) doped with boron for forming S/D features for a p-type FET. In some embodiments, the S/D features include silicon doped with phosphorous for forming S/D features for an n-type FET.

In an embodiment, at operation 126, the method continues to remove the dummy gate stacks to expose the channel regions of the fins, such as the channel region 1232 of the fin 802 and the channel region 1234 of the fin 804. The dummy gate stacks, which include the poly layer and any other layers thereunder, are removed to form respective openings. In an embodiment, the dummy gate stack removal includes one or more etching processes, such as wet etching, dry etching, or other etching techniques. The operation 126 may further form nanowire channels (or bar-shaped channels) in the exposed channel regions. Referring to the example of FIG. 10, in the channel region 1232 of the fin 802, the semiconductor layers 208, or portions thereof, are removed. As a result, portions of the semiconductor layers 210 in the channel region 1232 are suspended in the respective opening. In the channel region 1234 of the fin 804, the semiconductor layers 214, or portions thereof, are removed. As a result, portions of the semiconductor layers 212 in the channel region 1234 are suspended in the respective opening. In an embodiment, in each channel region, the semiconductor layers to be removed are etched by a selective wet etching process while the other semiconductor layers with different composition remain substantially unchanged. In some embodiments, the selective wet etching process may include a hydro fluoride (HF) or NH$_4$OH etchant. In an embodiment where the semiconductor layers 208 includes SiGe and the semiconductor layers 210 includes Si, the selective removal of the SiGe layers 208 may include a SiGe oxidation process followed by a SiGeO$_x$ removal. For example, the SiGe oxidation process may include forming and patterning various masking layers such that the oxidation is controlled to the SiGe layers 208. In other embodiments, the SiGe oxidation process is a selective oxidation due to the different compositions of the semiconductor layers 208 and 210. In some examples, the SiGe oxidation process may be performed by exposing the device 200 to a wet oxidation process, a dry oxidation process, or a combination thereof. Thereafter, the oxidized semiconductor layers 208, which include SiGeO$_x$, are removed by an etchant such as NH$_4$OH or diluted HF.

In an embodiment, at operation 128, the method continues to form gate stacks 1212 and 1226 over the channel regions 1232 and 1234 of the fins 802 and 804, respectively. Referring to the example of FIG. 11A, the gate stacks fill the openings in the channel regions and wrap around each of the exposed semiconductor layers (e.g., nanowires), such as the semiconductor layers 210 in the channel region 1232 and the semiconductor layers 212 in the channel regions 1234. In the present embodiment, the gate stacks include a dielectric layer which may consist of one or multiple layers of dielectric materials on interior surfaces of the opening and directly wrapping over each of the channel semiconductor layers. The dielectric layer may include a dielectric material such as silicon oxide or silicon oxynitride, and may be formed by chemical oxidation, thermal oxidation, ALD, CVD, and/or other suitable methods. The dielectric layer may also include a high-k dielectric layer such as hafnium oxide, zirconium oxide, lanthanum oxide, titanium oxide, yttrium oxide, strontium titanate, other suitable metal-oxides, or combinations thereof; and may be formed by ALD and/or other suitable methods. The gate stacks further include a gate metal stack which may consist of one or multiple layers over the dielectric layer(s), and a metal fill layer over the gate metal stack. The gate metal stack may include a work function metal layer. The work function metal layer may be a p-type work function metal layer or an n-type work function metal layer. The p-type work function metal layer comprises a metal selected from, but not limited to, the group of titanium nitride, tantalum nitride, ruthenium, molybdenum, tungsten, platinum, or combinations thereof. The n-type work function metal layer comprises a metal selected from, but not limited to, the group of titanium, aluminum, tantalum carbide, tantalum carbide nitride, tantalum silicon nitride, or combinations thereof. The p-type or n-type work function metal layer may include a plurality of layers and may be deposited by CVD, PVD, and/or other suitable process. The metal fill layer may include aluminum, tungsten, cobalt, copper, and/or other suitable materials, and may be formed by CVD, PVD, plating, and/or other suitable processes. The gate stacks wraps around the vertically-stacked horizontally-oriented channel semiconductor layers. Hence, the semiconductor structure 200 is a stacked horizontal gate-all-around (S-HGAA) device. In an embodiment, after the gate stacks are deposited, a CMP process is performed to planarize a top surface of the semiconductor structure 200.

Further processes may be performed to complete the fabrication of the S-HGAA device 200. For example, the method may continue to form contact openings, contact metal, as well as various contacts, vias, wires, and multilayer interconnect features (e.g., metal layers and interlayer dielectrics) over the substrate 202, configured to connect the various features to form a functional circuit that may include one or more multi-gate devices.

Embodiments of the method 100 have been discussed above with reference to FIGS. 2-11B and the structure 200, which are intended to be exemplary as various other embodiments of the present disclosure provide many benefits to a semiconductor device and a formation process thereof. For example, FIGS. 13A-D illustrate another example of the method 100 as applied to an exemplary semiconductor structure 200' including a bulk substrate 202. The operations of the method 100 are similar to what have been discussed above. Hence, FIGS. 13A-D are briefly described and reference numerals are repeated here to show the same or similar features and the description above applies equally to the present embodiment.

In an embodiment of the method 100, referring to the example of FIG. 13A, in operation 102 the substrate 202 is provided. The substrate 202 may be a single contiguous semiconductor substrate such as a silicon substrate. The substrate 202 may include various layers, including conductive or insulating layers formed on a semiconductor substrate. The substrate 202 may include various doping configurations. In an embodiment, the substrate 202 does not include an epitaxially grown stack (e.g., such as illustrated in FIG. 2).

In an embodiment of the method 100, in operation 104 the patterning mask is formed over the substrate. Exemplary FIG. 13A shows a patterned mask formed on the top surface of the substrate 202 to cover a first region 370 and expose a second region 380. The pattern mask layer may include a hard mask 302 and a patterned resist layer 310 formed on the hard mask 302.

In an embodiment of the method 100, the method proceeds to operation 106 where the semiconductor substrate is etched using the mask of operation 104. Exemplary FIG. 13B shows the substrate 202 in the region 380 is partially removed in an etching process to form a recess 318. The etching process may include dry etch, wet etch, or a combination thereof. The hard mask 302 protects the substrate 202 in the region 370 from etching. The method then proceeds to operation 108 where a dielectric material may be deposited. The deposition of the dielectric material may be substantially similar to as discussed above with reference to operation 108. Referring to the example of FIG. 13B, the dielectric material layer 502 is deposited conformally on the semiconductor structure 200', covering the horizontal surfaces of the regions 370 and 380, as well as the vertical surface of the sidewall of the recess 318. The dielectric material layer 502 and the hard mask 302 may exhibit etch selectivity.

The method then proceeds to an embodiment of the operation 110, where the dielectric material is etched. The etching may be substantially similar to the etching discussed above with reference to the operation 110 and the structure 200. Exemplary FIG. 13C shows portions of the dielectric material layer 502 deposited on the horizontal surface of the semiconductor structure 200' is removed, while the portions on the vertical sidewall remain. To remove portions of the dielectric material 502, an anisotropic etching such as a dry or plasma etching, may be performed. Due to etch selectivity, the hard mask 302 remains substantially unetched on the top surface of the substrate 202 in the region 370.

The method then proceeds to an embodiment of the operation 112 where an epitaxial stack is grown, substantially similar to as discussed above with reference to exemplary structure 200. Using the example of FIG. 13C, a stack of alternatingly disposed semiconductor layers 212 and 214 are epitaxially grown in the region 202. The layers 212 and 214 may be substantially similar to as discussed above including with reference to FIG. 7. Each of the semiconductor layers 212 and 214 may include silicon, silicon germanium, or other suitable elementary semiconductor material or compound semiconductor material, while the two semiconductor layers 212 and 214 have different compositions. As an example, the semiconductor layer 212 includes silicon germanium and the semiconductor layer 214 includes silicon. In various embodiments, the two semiconductor layers 212 and 214 have compositions that provide for different oxidation rates and/or different etch selectivity. Due to the blocking of the dielectric material layer 502, the stack of the semiconductor layers 212 and 214 is limited to grow in vertical direction only from the top surface of the substrate 202 exposed in the region 380, avoiding lateral epitaxial growth from the sidewall of the recess 318. Therefore, each of the semiconductor layers 212 and 214 exhibit the same crystal orientation with the substrate 202, without a "turning region" as discussed above.

The embodiment of the method 100 may further proceed to operations 114 and 116. Exemplary FIG. 13D shows the patterning of the semiconductor structure 200' to form one or more fins extending from the substrate 202, such as the fin 802 in the region 370 and the fin 804 in the region 380. In the illustrated embodiment, the fin 802 has the same composition as the substrate 202, while the fin 804 includes a stack of the semiconductor layers 212 and 214. The isolation provided from the dielectric material layer 502 allows the two fins 802 and 804 to be closely packed without the extra thickness inserted between from the turning region should the epitaxial growth originate from a sidewall the substrate 202. In an embodiment, the two fins 802 and 804 are spaced by a spacing S less than 50 nm. Some embodiments of the method 100 may proceed ahead to finish the FETs on the fins 802 and 804 of FIGS. 11A and 11B substantially similar to as discussed above. In the illustrated embodiment, the FET 1202 has a channel region 1232 formed of a contiguous semiconductor material same as the substrate 202, while the other FET 1204 has a channel region 1234 formed of a stack of alternating semiconductor layers or a stack of nanowires (e.g., by removing one of the semiconductor layers 212 or 214 in operation 126).

Figure 14B:
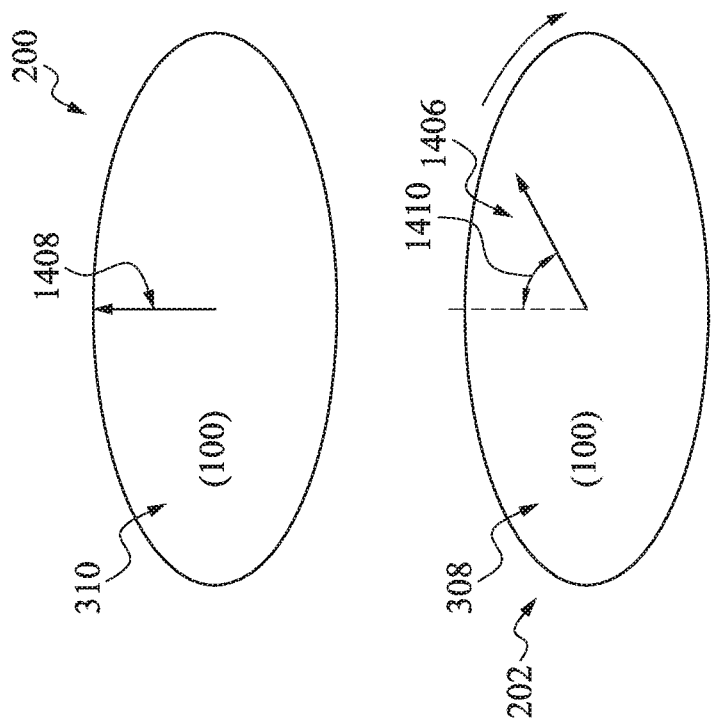
Figure 14A:
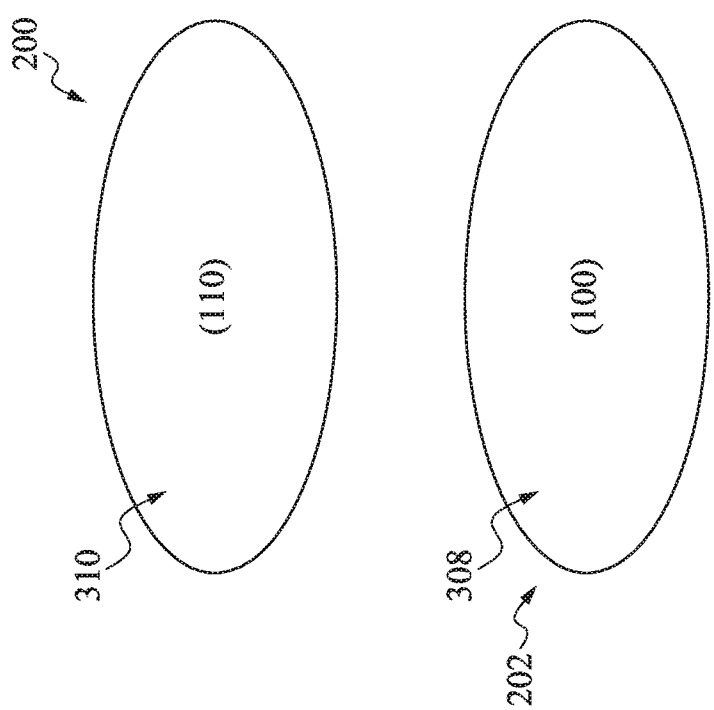
Figures 2, 14C:
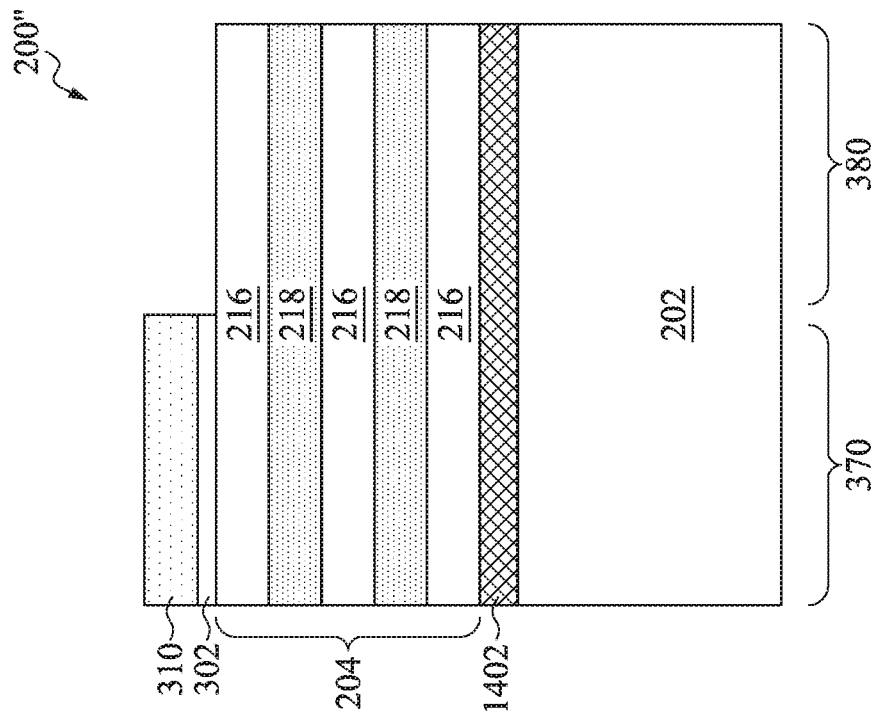
Figures 1, 14C:
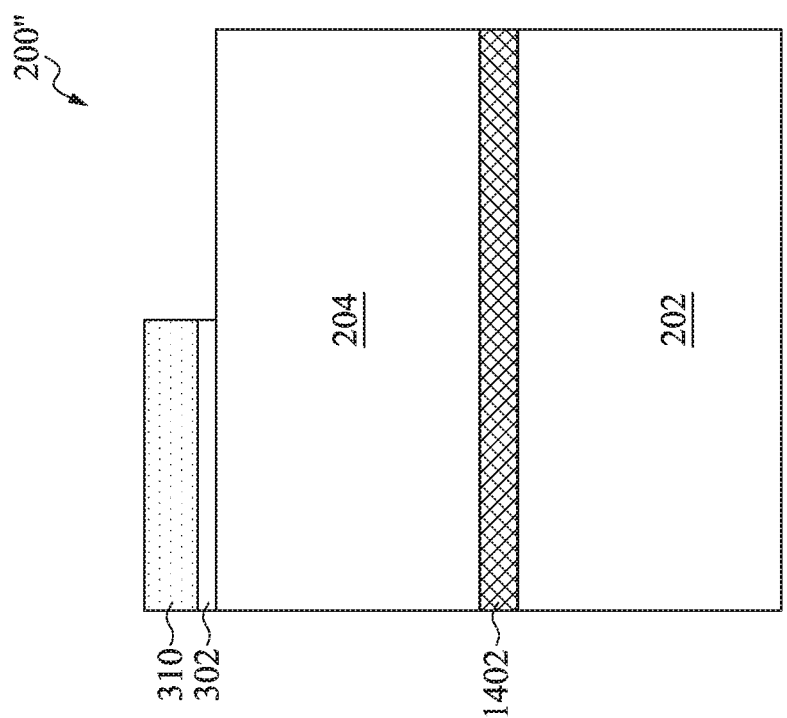

FIGS. 14A-14J illustrate yet another exemplary embodiment of the method 100 by beginning at block 102 with a semiconductor structure 200" including a stack of two different semiconductor substrates bonded together. FIG. 14A illustrates an exemplary embodiment of a substrate 202 and substrate 204 bonded together. In some embodiments, the first semiconductor substrate 202 and the second semiconductor substrate 204 have different crystalline structures and crystal plane orientations. For example, the semiconductor substrate 202 may have a top surface 308 in a (100) crystal plane and the semiconductor substrate 204 may have a top surface 310 in a (110) crystal plane, as shown in exemplary FIG. 14A. Alternatively, the first semiconductor substrate 202 and the second semiconductor substrate 204 may be same in terms of crystalline structure and plane orientation, such as both have top surfaces 308 and 310 in a (100) crystal plane, as shown in exemplary FIG. 14B. Accordingly, the crystal directions <110> of the semiconductor substrates 202 and 204 are oriented in the top surface of the respective substrates and are labeled as 1406 and 1408, respectively. Here <110> is another Miller indices representing a family of crystal directions of a crystalline semiconductor substrate. As depicted in FIG. 14B, the semiconductor substrates 202 and 204 are rotated and configured so that the corresponding crystal directions 1406 and 1408 are offset with an angle 1410 therebetween. In some embodiments, the angle 1410 is about 45° degree.

In some embodiments, the two semiconductor substrates 202 and 204 are silicon substrates. However, the disclosed structure and the method are not limiting and are extendable to other suitable semiconductor substrates and other suitable crystal orientations. For examples, either of the semiconductor substrates 202 and 204 may include an elementary semiconductor, such as germanium; a compound semiconductor, such as silicon germanium, silicon carbide, gallium arsenic, gallium phosphide, indium phosphide, indium arsenide, and/or indium antimonide; or combinations thereof, in the same or different crystalline structures.

The example of FIG. 14C-1 illustrates the two semiconductor substrates 202 and 204 are bonded together with such configuration through a proper bonding technology, such as direct bonding, eutectic bonding, fusion bonding, diffusion bonding, anodic bonding or other suitable bonding method. In one embodiment, the substrates are bonded together by direct silicon bonding (DSB). For example, the direct silicon bonding process may include preprocessing, pre-bonding at a lower temperature and annealing at a higher temperature. A buried silicon oxide layer (BOX), or referred to as silicon oxide layer 1402, may be implemented when the two substrates are bonded together. In some examples, the semiconductor substrates 202 and 204 may be thinned down, such as by grinding or polishing, to proper thicknesses before the bonding.

The method 100 proceeds in an embodiment to operation 104 where a patterned mask is formed over the substrate(s) described above with operation 102 and the exemplary embodiment of FIG. 14C-1. The patterning mask may be substantially similar as discussed above including with reference to the example of FIG. 3. As illustrated in FIG. 14C-1, a patterned mask including a hard mask 302 and a patterned resist layer 310 is formed subsequently on the top surface of the substrate 204 to cover a first region 370 and expose a second region 380.

In some alternative embodiments, as shown in FIG. 14C-2, the semiconductor substrate 204 further includes a stack of alternatingly disposed semiconductor layers 216 and 218 that are epitaxially grown and substantially similar to as discussed above including with reference to the example of FIG. 2. Each of the semiconductor layers 216 and 218 may include silicon, silicon germanium, or other suitable elementary semiconductor material or compound semiconductor material. In some embodiments, the two semiconductor layers 216 and 218 have different compositions from one another. As an example, the semiconductor layer 216 includes silicon and the semiconductor layer 218 includes silicon germanium. As another example, the semiconductor layer 216 includes silicon germanium and the semiconductor layer 218 includes silicon. Each of the semiconductor layers 216 and 218 has the same crystalline structure and the same plane orientation as the semiconductor substrate 204, which are different from the semiconductor substrate 202.

The method 100 then proceeds to operation 106 where a portion of the substrate(s) is etched. For the convenience of discussion, the semiconductor structure 200" as shown in FIG. 14C-1 is used as an example for subsequent operations. Persons having ordinary skill in the art should recognize that the semiconductor structure 200" as shown in FIG. 14C-2 can also be used for the subsequent operations. Exemplary FIG. 14D shows etching the second semiconductor substrate 204 in the second region 380 until the first substrate 202 is exposed within the second region 380, resulting in a recess 318. The etching process is designed to selectively remove the semiconductor material in the second region 380 using the hard mask 302 as an etch mask. The etching process may further continue to recess the first semiconductor substrate 202 to ensure the first semiconductor substrate 202 within the second region 380 is exposed. The etching process may include dry etch, wet etch or a combination thereof. The hard mask 302 protects the second substrate 204 within the first region 370 from etching. In various examples, the etching process may include a dry etch with a suitable etchant, such as fluorine-containing etching gas or chlorine-containing etching gas, such as $Cl_2$, $CCl_2F_2$, $CF_4$, $SF_6$, $NF_3$, $CH_2F_2$ or other suitable etching gas. In some other examples, the etching process may include a wet etch with a suitable etchant, such as KOH solution. The etching process may include more than one step. For example, the etching process may include a first etching step to etch the silicon material of the second substrate 204 and a second etching step to etch the silicon oxide layer 1402. In furtherance of the example, the etching process includes a dry etch step using fluorine-containing etching gas or chlorine-containing etching gas to etch silicon and a wet etch step using hydrofluoric acid to etch silicon oxide. The top surface of the semiconductor substrate 202 exposed in the recess 318 may be lower than a bottom surface of the silicon oxide layer 1402 by a height h'. In some embodiments, the height h' ranges from about 1 nm to about 50 nm.

Similar to as discussed above with reference to FIGS. 5 and 13B and the operation 108, subsequently, a dielectric material layer 502 is deposited conformally on the semiconductor structure 200" (FIG. 14D), covering the horizontal surfaces of the regions 370 and 380, as well as the vertical surface of the sidewall of the recess 318. The dielectric material layer 502 and the hard mask 302 may have compositions that provide for etch selectivity.

The embodiment of the method then proceeds to operation 110 where a portion of the dielectric layer is etched. Exemplary FIG. 14E shows portions of the dielectric material layer 502 deposited on the horizontal surface of the semiconductor structure 200" is removed, while the portions on the vertical sidewall remain. To remove portions of the dielectric material, an anisotropic etching such as a dry or plasma etching, may be performed. Thereafter, the method proceeds to operation 112 where a stack of alternatingly disposed semiconductor layers 212 and 214 are epitaxially grown in the region 380 substantially similar to as discussed above. Each of the semiconductor layers 212 and 214 may include silicon, silicon germanium, or other suitable elementary semiconductor material or compound semiconductor material. In some embodiments, the two semiconductor layers 212 and 214 have different compositions from one another. As an example, the semiconductor layer 212 includes silicon germanium and the semiconductor layer 214 includes silicon. Due to the blocking of the dielectric material layer 502 on the sidewall of the recess 318, the stack of the semiconductor layers 212 and 214 is limited to grow in vertical direction from the top surface of the substrate 202 exposed in the region 380, avoiding lateral epitaxial growth from the sidewall of the recess 318. Therefore, each of the semiconductor layers 212 and 214 exhibit the same crystal orientation with the substrate 202, without a turning region formed in different crystal orientations.

Some embodiment of the method 100 may then continue to one or more of the remaining operations including operations 114, 116, 118, and 120. Exemplary FIG. 14F shows the patterning of the semiconductor structure 200" to form one or more fins extending from the substrate 202, such as the fin 802 in the region 370 and the fin 804 in the region 380. The fin 802 has a top portion including the same composition as the substrate 204 and a bottom portion including the same composition as the substrate 202, with the silicon oxide layer 1402 disposed therebetween. The fin 804 includes a stack of the semiconductor layers 212 and 214. The isolation provided from the dielectric material layer 502 allows the two fins 802 and 804 to be closely packed. In some embodiments, a turning region formed by vertical epitaxial growth from a sidewall of substrate 204 and/or 202 is reduced and/or eliminated.

Figure 14G:
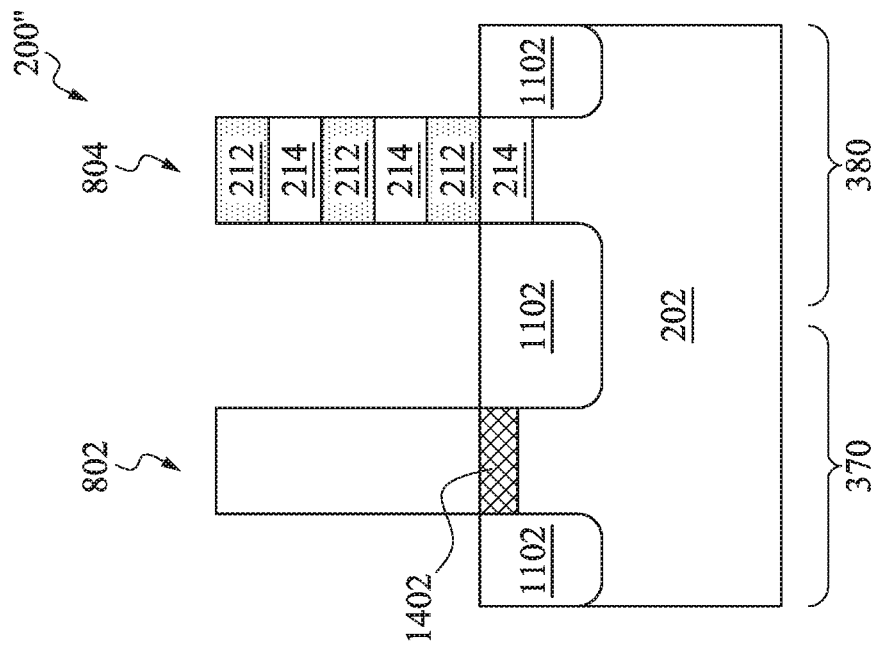
Figure 14F:
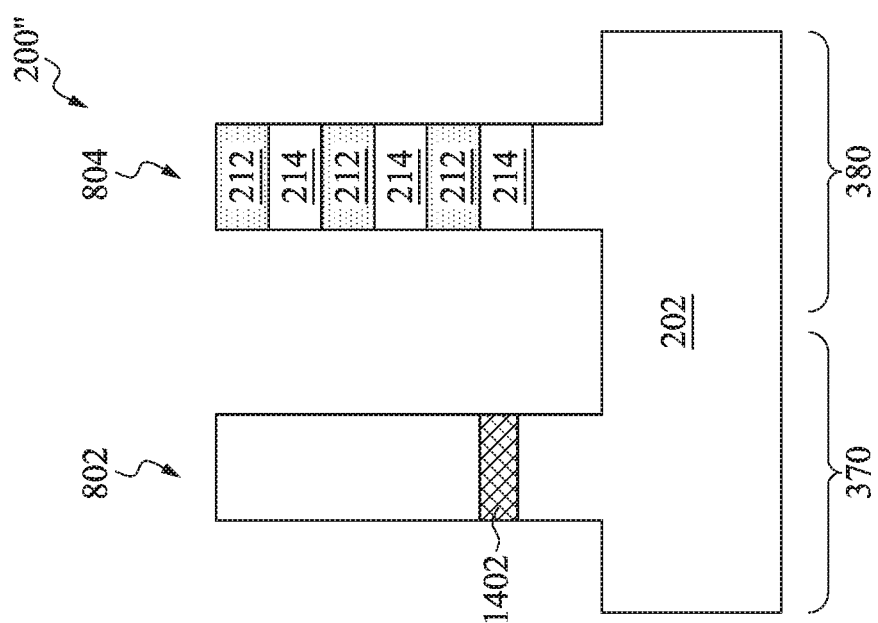

Exemplary FIG. 14G shows the method 100 forms shallow trench isolation (STI) features 1102 to isolate various fin-type active regions. The formation of the STI features 1102 may further includes a first step to fill in the trenches between fins with one or more dielectric material; a second step to polish the semiconductor structure 200" to remove excessive dielectric material and planarize the top surface; and a third step to recess the STI features 1102 by selective etching. In an embodiment, the top portion of the fin 802 extends out from the STI feature 1102, while the bottom portion and the silicon oxide layer 1402 is below the STI features 1102.

Figures 2, 14H:
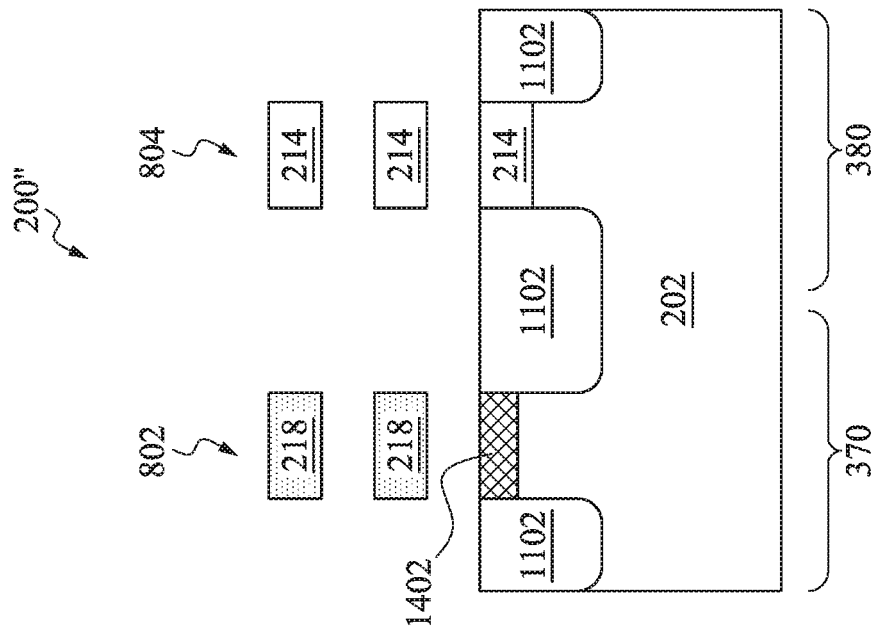
Figures 1, 14H:
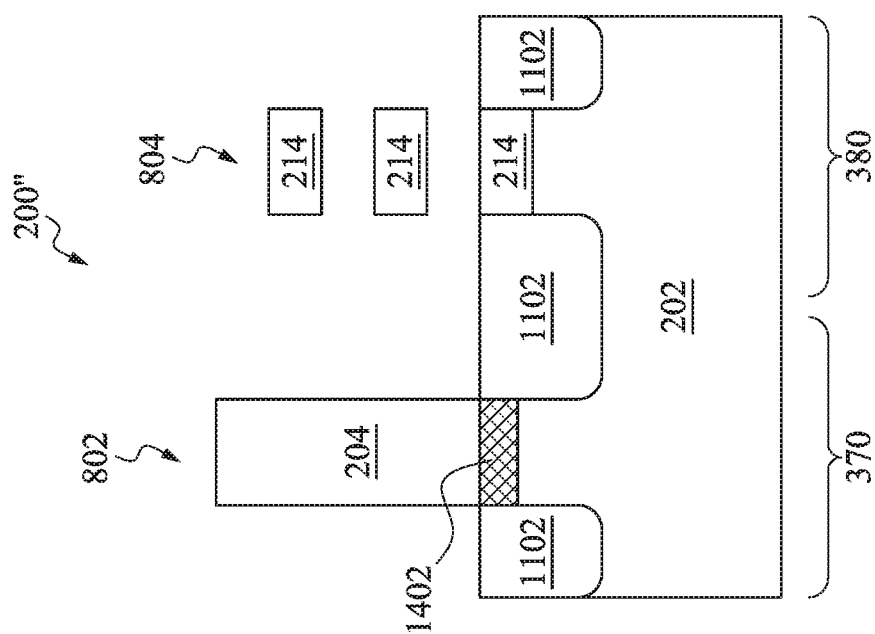

Embodiments of method 100 exemplified by the structure 200" may proceed ahead to finish the FETs on the fins 802 and 804. Referring to FIG. 14H-1, by bonding two semiconductor substrates 202 and 204, the semiconductor structure 200 provides further performance enhancement for p-type FET and n-type FET. For example, the (110) crystal plane has higher atomic density than the (100) crystal plane and hence may be better for a channel in the p-type FET due to the most number of covalent bonds that is better for hole conduction. By using the semiconductor substrate 204 in the (110) crystal plane as a channel, a p-type FET formed on the fin 802 may have enhanced hole mobility, while the n-type FET formed on the fin 804 keeps the epitaxially gown layers in the same (100) crystal plane as the semiconductor substrate 202, which enhances electron mobility. In furtherance of the embodiment, one of the semiconductor layers 212 and 214 may be removed in the channel region by selective etching to form a stack of nanowires (e.g., by removing the silicon germanium layers 212). Therefore, in an embodiment, the FET 1202 has a channel region 1232 formed of semiconductor material in the (110) crystal plane same as the semiconductor substrate 204, while the other FET 1204 has a channel region 1234 formed of a stack of alternating semiconductor layers or a stack of nanowires with semiconductor material in the (100) crystal plane same as the semiconductor substrate 202. The gate stack of the FET 1204 fills the openings in the channel region and wraps around each of the exposed semiconductor layers (e.g., nanowires). In another embodiment, the FET 1202 has a channel region 1232 formed of semiconductor material in the same crystal plane as the nanowires in a channel region 1234 in the FET 1204, while the channel region 1232 has a crystal direction (e.g., <110> crystal direction) in an offset angle rotated from the corresponding crystal direction of the channel region 1234. The crystal direction may align with the direction the fins orient lengthwise. The offset angle may be about 45° degree.

Referring to FIG. 14H-2, in some alternative embodiments, such as for the bonded semiconductor substrate 204 having a stack of alternatingly disposed semiconductor layer (e.g., the structure 200" as shown in FIG. 14C-2), after the method 100 proceeds ahead to finish the FETs on the fins 802 and 804, the region 370 may include a stack of alternating semiconductor layers 218 (or a stack of nanowires 218) above the silicon oxide layer 1402 and the region 380 may include a stack of alternating semiconductor layers 214 (or a stack of nanowires 214). Accordingly, in an embodiment, the FET 1202 has a channel region 1232 formed of a stack of alternating semiconductor layers or a stack of nanowires with crystalline semiconductor materials having a crystal lattice with top surface in a (110) crystal plane, which is the same as the semiconductor substrate 204, while the other FET 1204 has a channel region 1234 formed of a stack of alternating semiconductor layers or a stack of nanowires with crystalline semiconductor materials having a crystal lattice with top surface in a (100) crystal plane, which is the same as the semiconductor substrate 202. The gate stacks of the FETs 1202 and 1204 fill the openings in the respective channel regions and wrap around each of the exposed semiconductor layers or nanowires. In yet another embodiment, where the bonded semiconductor substrate 204 has the same crystal plane as the semiconductor substrate 202 but with an offset crystal direction (e.g., FIG. 14B), the FET 1202 has the nanowires 218 in the same crystal plane as the nanowires 214 in the FET 1204, while the semiconductor material of the nanowires 218 has a crystal direction (e.g., <110> crystal direction) in an offset angle rotated from the corresponding crystal direction of semiconductor material of the nanowires 214. The crystal direction may align with the direction the nanowires orient lengthwise. The offset angle may be about 45° degree.

Figure 14J:
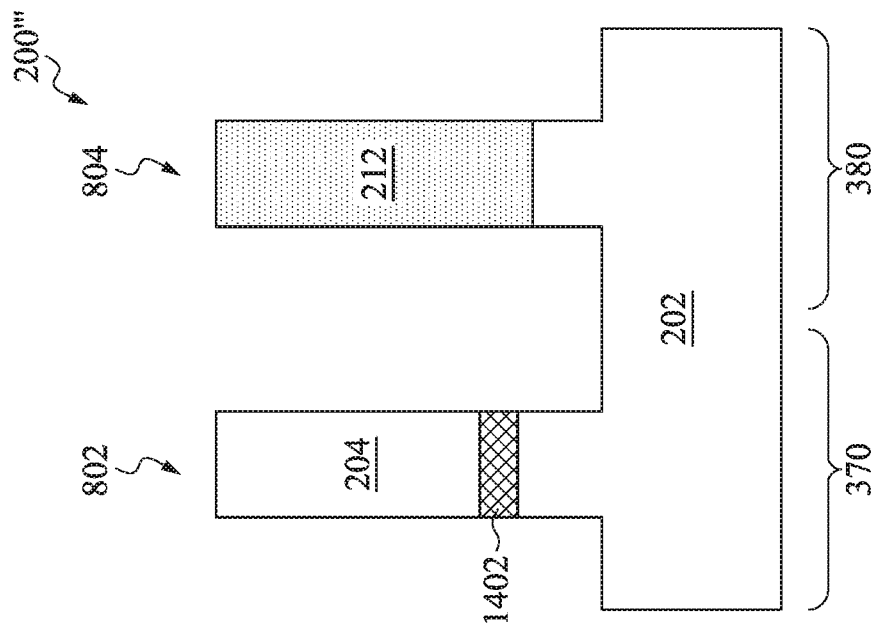
Figure 14I:
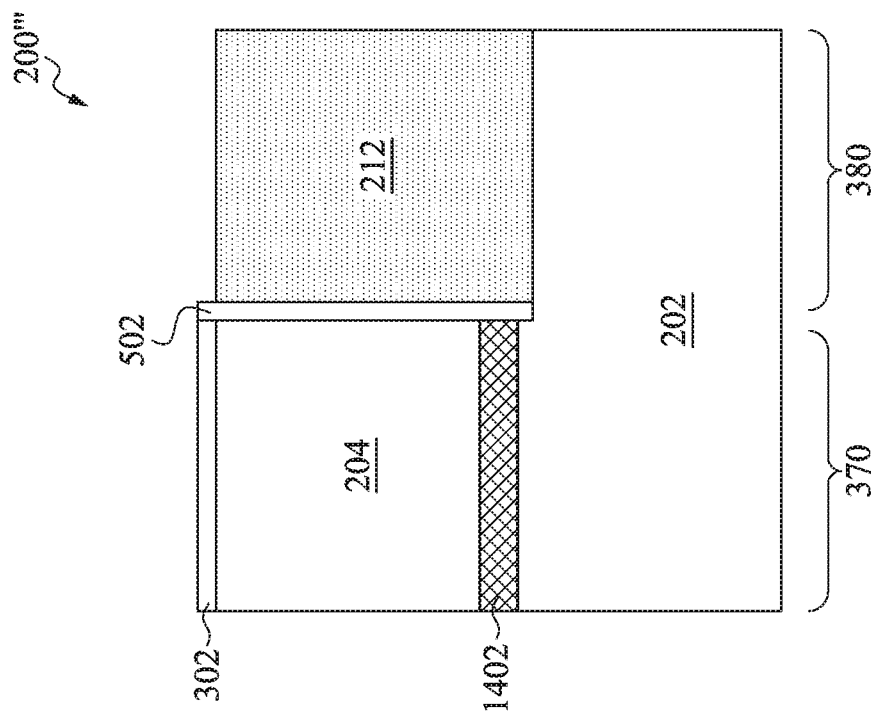

In another embodiment of the method 100, after depositing and/or etching the dielectric layer in operations 108 and 110 as illustrated by the exemplary structure 200" of FIG. 14D, in some regions of the substrate rather than the epitaxial growth provided in block 112 discussed above, a single semiconductor material may be grown on the substrate. Referring to the example of FIG. 14I and structure 200''', a bulk semiconductor material 212 can be grown from the exposed top surface of the semiconductor substrate 202 and thereby exhibits the same crystal orientation as the substrate 202. The semiconductor material 212 may have same or different composition from the semiconductor substrate 202. The semiconductor material 212 may include silicon, silicon germanium, or other suitable elementary semiconductor material or compound semiconductor material. In some embodiments, the bottom surface of the semiconductor material 212 is below the silicon oxide layer 1402. The dielectric material layer 502 provides isolation between the region 370 and the region 380 during the epitaxial growth. Exemplary FIG. 14J shows the patterning of the semiconductor structure 200''' to form two fins 802 and 804, however any number of fins is possible. Both the fins 802 and 804 have contiguous semiconductor material in the channel regions. The fin 802 has a channel region in the same crystal plane and orientation as the semiconductor substrate 204, such as in a (110) plane that enhances hole mobility in a p-type FET; the fin 804 has a channel region in the same crystal plane and orientation as the semiconductor substrate 202, such as in a (100) plane that enhances electron mobility in an n-type FET.

Although not intended to be limiting, one or more embodiments of the present disclosure provide many benefits to a semiconductor device and a formation process thereof. For example, some embodiments of the present disclosure form fin features for stacked horizontal gate-all-around (S-HGAA) devices. The fin features may be formed to have a narrow separation to fit into a tight fin-to-fin spacing. This advantageously increases the level of integration for the S-HGAA devices. Further, embodiments of the present disclosure may be used to form S-HGAA devices with channel regions in multiple crystal planes and/or crystal orientations, providing for great flexibility and performance enhancement. Still further, embodiments of the present disclosure may be integrated into existing CMOS fabrication flow, providing for improved process window.

In one exemplary aspect, the present disclosure is directed to a method. The method includes providing a semiconductor structure that includes a first semiconductor material extending from a first region to a second region; removing a portion of the first semiconductor material in the second region to form a recess, the recess exposing a sidewall of the first semiconductor material disposed in the first region; and forming a dielectric material covering the sidewall. The method further includes while the dielectric material covers the sidewall, epitaxially growing a second semiconductor material in the second region adjacent the dielectric material. The method further includes forming a first fin including the first semiconductor material and a second fin including the second semiconductor material.

In another exemplary aspect, the present disclosure is directed to a method of forming a semiconductor device. The method includes providing a substrate having a plurality of first semiconductor layers and a plurality of second semiconductor layers disposed over the substrate, the first semiconductor layers having a different material composition than the second semiconductor layers and the first and second semiconductor layers being alternatingly disposed with respect to each other in a vertical direction; forming a patterned mask over a first region of the substrate; while the patterned mask is over the first region, removing the pluralities of first and second semiconductor layers in a second region of the substrate such that a sidewall of the pluralities of first and second semiconductor layers in the first region is exposed. The method further includes conformally depositing a dielectric material layer over the substrate including the sidewall; while the dielectric material layer is disposed on the sidewall, epitaxially growing a plurality of third semiconductor layers and a plurality of fourth semiconductor layers in the second region, the plurality of third semiconductor layers having a different material composition than the plurality of fourth semiconductor layers and the pluralities of third and fourth semiconductor layers being alternatingly disposed with respect to each other in the vertical direction; and patterning the pluralities of first, second, third, and fourth semiconductor layers to form a first fin in the first region and a second fin in the second region.

In yet another exemplary aspect, the present disclosure is directed to a semiconductor structure. The semiconductor structure includes a semiconductor substrate having a first region and a second region; a first semiconductor structure disposed over the semiconductor substrate within the first region; and a second semiconductor structure disposed over the semiconductor substrate within the second region, wherein in a plane intersecting the first and second semiconductor structures, the first semiconductor structure has a (110) crystal plane and the second semiconductor structure has a (100) crystal plane, the plane being parallel to a top surface of the semiconductor substrate.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a semiconductor structure that includes a semiconductor substrate and a first semiconductor material extending from a first region to a second region over the semiconductor substrate, wherein the semiconductor substrate and the first semiconductor material have different crystalline orientations in both the first region and the second region, wherein the semiconductor structure includes a dielectric layer stacked between the semiconductor substrate and the first semiconductor material;
removing a portion of the first semiconductor material in the second region to form a recess, the recess exposing a sidewall of the first semiconductor material disposed in the first region, wherein the removing of the portion of the first semiconductor material also includes removing a portion of the dielectric layer to expose a top surface of the semiconductor substrate in the second region;
forming a dielectric material covering the sidewall; and
while the dielectric material covers the sidewall, epitaxially growing a second semiconductor material in the second region adjacent the dielectric material, wherein the semiconductor substrate and the second semiconductor material have the same crystalline orientation.

2. The method of claim 1, wherein the forming of the dielectric includes:
depositing the dielectric material covering the semiconductor structure in the first and second regions; and
removing a portion of the dielectric material from the second region, wherein another portion of the dielectric material covering the sidewall and a top surface of the first semiconductor material in the first region remains.

3. The method of claim 1, wherein the removing of the portion of the first semiconductor material includes:
forming a mask covering the first semiconductor material in the first region; and
etching the first semiconductor material in the second region to form the recess and expose a top surface of the semiconductor substrate in the second region.

4. The method of claim 1, wherein:
the first semiconductor material is in a first crystalline structure with a top surface on a (110) crystal plane; and
the second semiconductor material is in a second crystalline structure with a top surface on a (100) crystal plane.

5. The method of claim 1, wherein:
the first semiconductor material includes a plurality of first semiconductor layers interleaved with a plurality of second semiconductor layers, the first and second semiconductor layers having different material compositions; and
the second semiconductor material includes a plurality of third semiconductor layers interleaved with a plurality of fourth semiconductor layers, the third and fourth semiconductor layers having different material compositions.

6. The method of claim 1, wherein:
the first semiconductor material includes a material composition uniformly throughout the first semiconductor material; and the second semiconductor material includes a plurality of third semiconductor layers interleaved with a plurality of fourth semiconductor layers, the third and fourth semiconductor layers having different material compositions.

7. The method of claim 1, wherein a bottom surface of the second semiconductor material is below a bottom surface of the dielectric layer.

8. The method of claim 1, wherein a bottom surface of the second semiconductor material is below a bottom surface of the first semiconductor material.

9. The method of claim 1, further includes:
patterning the first and second semiconductor materials to form a first fin in the first region and a second fin in the second region.

10. A method of forming a semiconductor device, comprising:
providing a substrate having a plurality of first semiconductor layers and a plurality of second semiconductor layers disposed over the substrate, the first semiconductor layers having a different material composition than the second semiconductor layers and the first and second semiconductor layers being alternatingly disposed with respect to each other in a vertical direction;
etching a portion of the pluralities of first and second semiconductor layers such that a sidewall of the pluralities of first and second semiconductor layers and a top surface of the substrate are exposed;
depositing a dielectric material layer over the sidewall; and
while the dielectric material layer is disposed on the sidewall, epitaxially growing a plurality of third semiconductor layers and a plurality of fourth semiconductor layers from the exposed top surface of the substrate, the dielectric material layer separating the plurality of third and fourth semiconductor layers from contacting the plurality of first and second semiconductor layers, the plurality of third semiconductor layers having a different material composition than the plurality of fourth semiconductor layers and the pluralities of third and fourth semiconductor layers being alternatingly disposed with respect to each other in the vertical direction, wherein a bottommost portion of the pluralities of third and fourth semiconductor layers is lower than a bottommost portion of the pluralities of first and second semiconductor layers.

11. The method of claim 10, wherein a bottommost portion of the dielectric material layer is below the bottommost portion of the pluralities of first and second semiconductor layers.

12. The method of claim 10, wherein each of the first, second, third, and fourth semiconductor layers has the same crystalline orientation.

13. The method of claim 10, wherein the first and second semiconductor layers have a first crystalline orientation, and the third and fourth semiconductor layers have a second crystalline orientation different from the first crystalline orientation.

14. The method of claim 10, wherein the first and second semiconductor layers are in a first crystalline structure with a first crystal direction of <110>, and the third and fourth semiconductor layers are in a second crystalline structure with a second crystal direction of <110> that is offset from the first crystal direction of <110>.

15. A semiconductor structure, comprising:
a semiconductor substrate having a first region and a second region; a first semiconductor structure disposed over the semiconductor substrate within the first region, the first semiconductor structure being operable as a first channel for conducting currents between first source/drain (S/D) features;
a dielectric layer stacked between the semiconductor substrate and the first semiconductor structure, wherein the dielectric layer separates the semiconductor substrate from contacting the first semiconductor structure, wherein a bottom surface of the first semiconductor structure is directly above a top surface of the dielectric layer; and
a second semiconductor structure disposed over the semiconductor substrate within the second region, the second semiconductor structure being operable as a second channel for conducting currents between second S/D features,
wherein the first and second semiconductor structures have different crystalline orientations; and
wherein a bottom surface of the second semiconductor structure is below a bottom surface of the dielectric layer.

16. The semiconductor structure of claim 15, wherein the dielectric layer is in physical contact with both the semiconductor substrate and the first semiconductor structure.

17. The semiconductor structure of claim 15, wherein the second semiconductor structure and the semiconductor substrate have the same crystalline orientation.

18. The semiconductor structure of claim 15, wherein a top surface of the first semiconductor structure has a (110) crystal plane and a top surface of the second semiconductor structure has a (100) crystal plane.

19. The semiconductor structure of claim 15, wherein the dielectric layer is an oxide layer.

\* \* \* \* \*